(12) United States Patent
Thompson et al.

(10) Patent No.: US 11,215,921 B2
(45) Date of Patent: Jan. 4, 2022

(54) RESIDUAL LAYER THICKNESS COMPENSATION IN NANO-FABRICATION BY MODIFIED DROP PATTERN

(71) Applicant: CANON KABUSHIKI KAISHA, Tokyo (JP)

(72) Inventors: Ecron D. Thompson, Round Rock, TX (US); Craig William Cone, Austin, TX (US); Logan L. Simpson, Coupland, TX (US); Wei Zhang, Austin, TX (US); James W. Irving, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 264 days.

(21) Appl. No.: 16/670,497

(22) Filed: Oct. 31, 2019

(65) Prior Publication Data
US 2021/0132491 A1 May 6, 2021

(51) Int. Cl.
*G03F 7/00* (2006.01)
*H01L 21/027* (2006.01)

(52) U.S. Cl.
CPC .......... *G03F 7/0002* (2013.01); *H01L 21/027* (2013.01)

(58) Field of Classification Search
CPC .. G03F 7/0002; H01L 21/027; H01L 21/0271
See application file for complete search history.

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 7,376,259 B1 | 5/2008 | Dakshina-Murthy et al. | |
| 8,066,930 B2 | 11/2011 | Sreenivasan et al. | |
| 8,076,386 B2 | 12/2011 | Xu et al. | |
| 8,119,052 B2 * | 2/2012 | Schumaker | B82Y 40/00 264/293 |
| 8,349,241 B2 | 1/2013 | Sreenivasan et al. | |

(Continued)

OTHER PUBLICATIONS

Eui Kyoon Kim et al., "Importance of evaporation in the design of materials for step and flash imprint lithography", Journal of Vacuum Science & Technology B: Microelectronics and Nanometer Structures Processing, Measurement, and Phenomena 23, 1515-1520, AIP Publishing, Melville, NY (Jul./Aug. 2005).

(Continued)

*Primary Examiner* — John P. Dulka
(74) *Attorney, Agent, or Firm* — Canon U.S.A., Inc., IP Division

(57) ABSTRACT

A fabrication method comprises selecting an initial drop pattern defining a position of drops of a formable material, the initial drop pattern comprising a grid pattern of drops, designating the drops of the grid pattern to be dispensed by a first series of nozzles of a dispenser based on a spacing between drops in the Y-dimension; generating a modified drop pattern by shifting the grid pattern in a first direction along the Y-dimension, wherein a shift distance is selected such that the drops of the shifted grid pattern are designated to be dispensed from a second series of nozzles of the dispenser; dispensing the plurality of drops according to the modified drop pattern onto a substrate; during the dispensing of the drops, shifting a position of the stage or dispenser along the Y-dimension opposite to the first direction by an amount equal to the shift distance.

20 Claims, 14 Drawing Sheets

(56) References Cited

U.S. PATENT DOCUMENTS

| | | | |
|---|---|---|---|
| 8,586,126 B2* | 11/2013 | Schumaker | B82Y 40/00 |
| | | | 427/8 |
| 10,739,576 B2* | 8/2020 | Igarashi | A61B 1/0011 |
| 2009/0014917 A1 | 1/2009 | Hodge | |
| 2009/0115110 A1 | 5/2009 | Schumaker | |
| 2010/0098859 A1 | 4/2010 | Schumaker | |
| 2014/0199472 A1 | 7/2014 | Kodama et al. | |
| 2015/0017329 A1* | 1/2015 | Fletcher | B29C 43/021 |
| | | | 427/277 |
| 2020/0174362 A1* | 6/2020 | Khusnatdinov | B41J 2/02 |
| 2020/0292934 A1* | 9/2020 | Simpson | B29C 59/022 |
| 2020/0401040 A1* | 12/2020 | Khusnatdinov | H01L 21/0271 |
| 2021/0042906 A1* | 2/2021 | Bean | G06T 7/13 |
| 2021/0232044 A1* | 7/2021 | Asada | G03F 7/0002 |

OTHER PUBLICATIONS

Ki-Don Kim, et al., "Minimization of residual layer thickness by using the optimized dispensing method in S-FIL process", Microelectronic Engineering, Jan. 31, 2006, 83(4-9):847-850, Elsevier B.V., Amsterdam NL, 2006.

Shravanthi Reddy, et al., "Simulation of Fluid Flow in the Step and Flash Imprint Lithography Process", Microelectronic Engineering, 2005, 82(1):60-70, Elsevier B.V., Amsterdam NL, 2005.

* cited by examiner

RESIDUAL LAYER THICKNESS COMPENSATION IN NANO-FABRICATION BY MODIFIED DROP PATTERN

BACKGROUND

Field of Art

The present disclosure relates to residual layer thickness compensation in nano-fabrication.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

A fabrication method comprises selecting an initial drop pattern defining a position of drops of a formable material in a two-dimensional plane having an X-dimension and a Y-dimension, the initial drop pattern comprising a grid pattern of drops, the grid pattern defining a spacing between the drops in the Y-dimension and the grid pattern having an initial position within the plane, designating the drops of the grid pattern to be dispensed by a first series of nozzles of a dispenser based on the spacing between drops in the Y-dimension and based on the initial position; generating a modified drop pattern by shifting the grid pattern in a first direction along the Y-dimension from the initial position to a shifted position, wherein a shift distance between the initial position and the shifted position is selected such that the drops of the shifted grid pattern are designated to be dispensed from a second series of nozzles of the dispenser; dispensing the plurality of drops according to the modified drop pattern onto a substrate as a stage supporting the substrate translates the substrate across the dispenser along the X-dimension or as the dispenser translates across the substrate along the X-dimension; during the dispensing of the drops of the shifted grid pattern, shifting a position of the stage or dispenser along the Y-dimension in a second direction opposite to the first direction by an amount equal to the shift distance between the initial position and the shifted position; and contacting the dispensed drops with a template or superstrate to form a film.

A dispensing system comprises a chuck configured to hold a template or superstrate; a stage configured to position a substrate; one or more processors configured to: select an initial drop pattern defining a position of drops of a formable material in a two-dimensional plane having an X-dimension and a Y-dimension, the initial drop pattern comprising a grid pattern of drops, the grid pattern defining a spacing between the drops in the Y-dimension and the grid pattern having an initial position within the plane; designate the drops of the grid pattern to be dispensed by a first series of nozzles of a dispenser based on the spacing between drops in the Y-dimension and based on the initial position; and generate a modified drop pattern by shifting the grid pattern in a first direction along the Y-dimension from the initial position to a shifted position, wherein a shift distance between the initial position and the shifted position is selected such that the drops of the shifted grid pattern are designated to be dispensed from a second series of nozzles of the dispenser; a fluid dispenser configured to dispense the plurality of drops according to the modified drop pattern onto a substrate as the stage translates the substrate across the dispenser along the X-dimension or as the dispenser translates across the substrate along the X-dimension, wherein during the dispensing of the drops of the shifted grid pattern, a position of the stage or dispenser is shifted along the Y-dimension in a second direction opposite to the first direction by an amount equal to the shift distance between the initial position and the shifted position; a positioning system configured to contact the dispensed drops with the template or superstrate to form a film; and a curing system configured to cure the dispensed drops under the template or superstrate so as to form a cured material on the substrate.

A method of making an article comprises selecting an initial drop pattern defining a position of drops of a formable material in a two-dimensional plane having an X-dimension and a Y-dimension, the initial drop pattern comprising a grid pattern of drops, the grid pattern defining a spacing between the drops in the Y-dimension and the grid pattern having an initial position within the plane; designating the drops of the grid pattern to be dispensed by a first series of nozzles of a dispenser based on the spacing between drops in the Y-dimension and based on the initial position; generating a modified drop pattern by shifting the grid pattern in a first direction along the Y-dimension from the initial position to a shifted position, wherein a shift distance between the initial position and the shifted position is selected such that the drops of the shifted grid pattern are designated to be dispensed from a second series of nozzles of the dispenser; dispensing the plurality of drops according to the modified drop pattern onto a substrate as a stage supporting the substrate translates the substrate across the dispenser along the X-dimension or as the dispenser translates across the substrate along the X-dimension; during the dispensing of the drops of the shifted grid pattern, shifting a position of the stage or dispenser along the Y-dimension in a second direction opposite to the first direction by an amount equal to the shift distance between the initial position and the shifted position; contacting the dispensed drops with a template or superstrate to form a film; forming the film of the dispensed drops on the substrate as a result of completing the contacting of the template or superstrate with the dispensed drops; and processing the formed pattern or layer to make the article These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1:
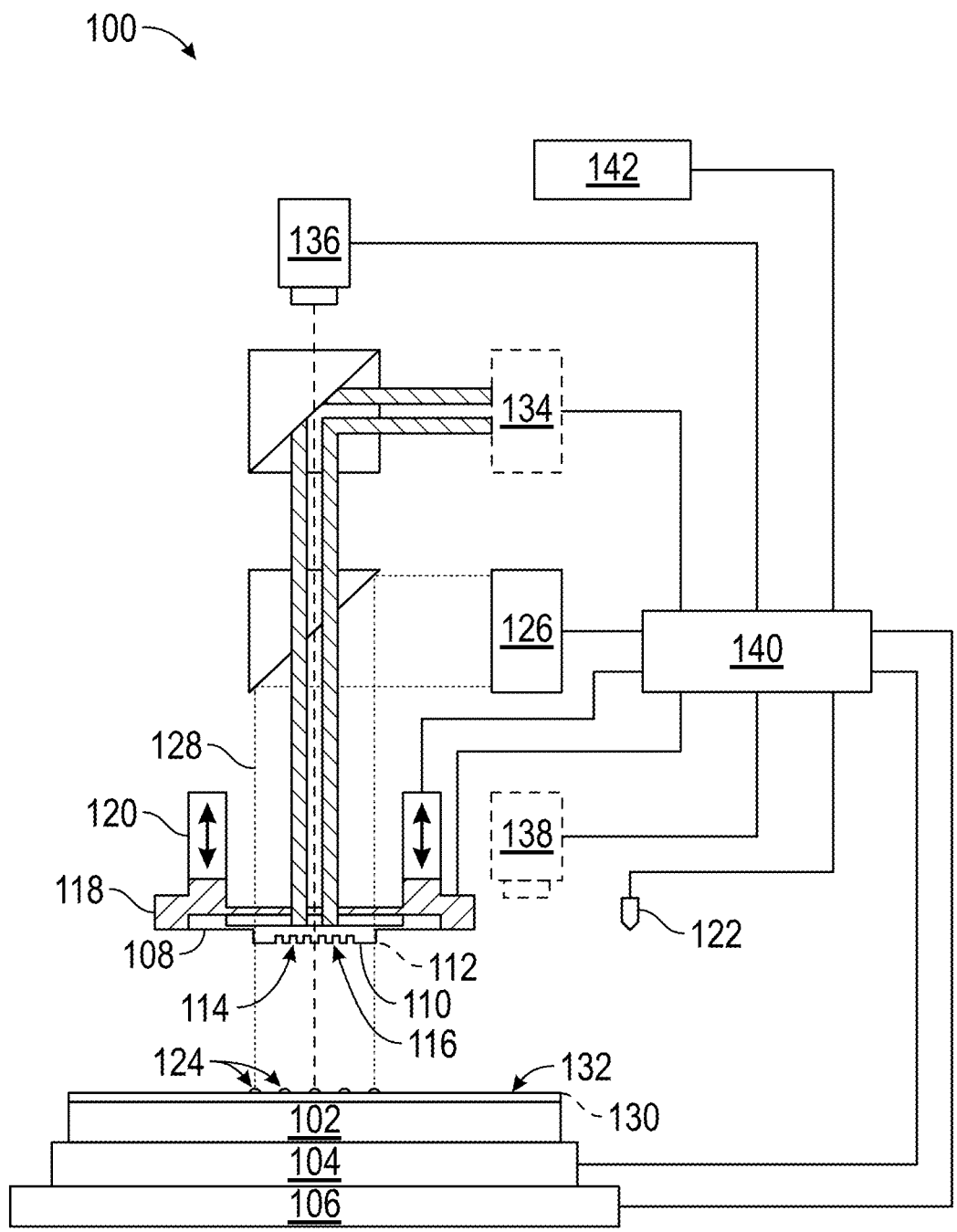
FIG. 1 is an illustration of an exemplary nanoimprint lithography system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

When performing an imprinting or planarization using a drop pattern having a combination of different grid patterns, as will be discussed below in more detail, it can be difficult to achieve a desired residual layer thickness (RLT) delta between different sections of the imprinted/planarized wafer. The farther the RLT delta is from the desired RLT delta, the more likely the final product will have defects. Disclosed herein fabrication method that minimizes the degree of deviation from the desired RLT delta, thereby reducing or eliminating defects in the final product.

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc, which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
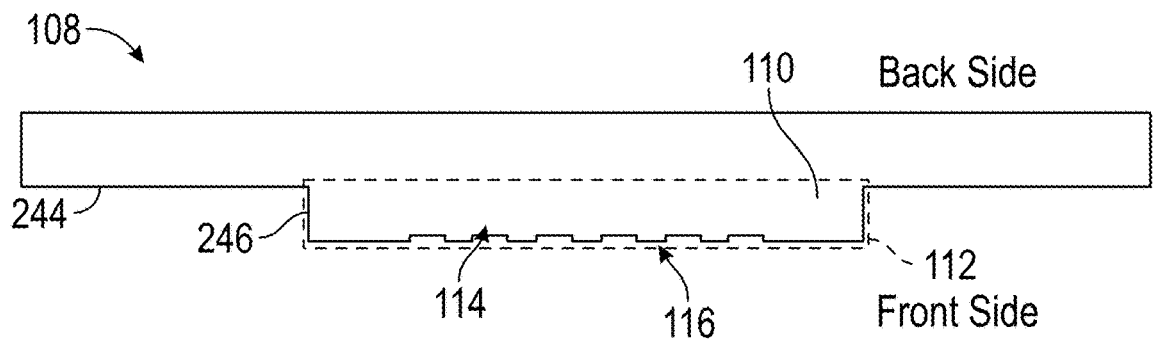
FIG. 2 is an illustration of an exemplary template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative template may be used in another embodiment, referred herein as a superstrate. In the case of the superstrate, the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
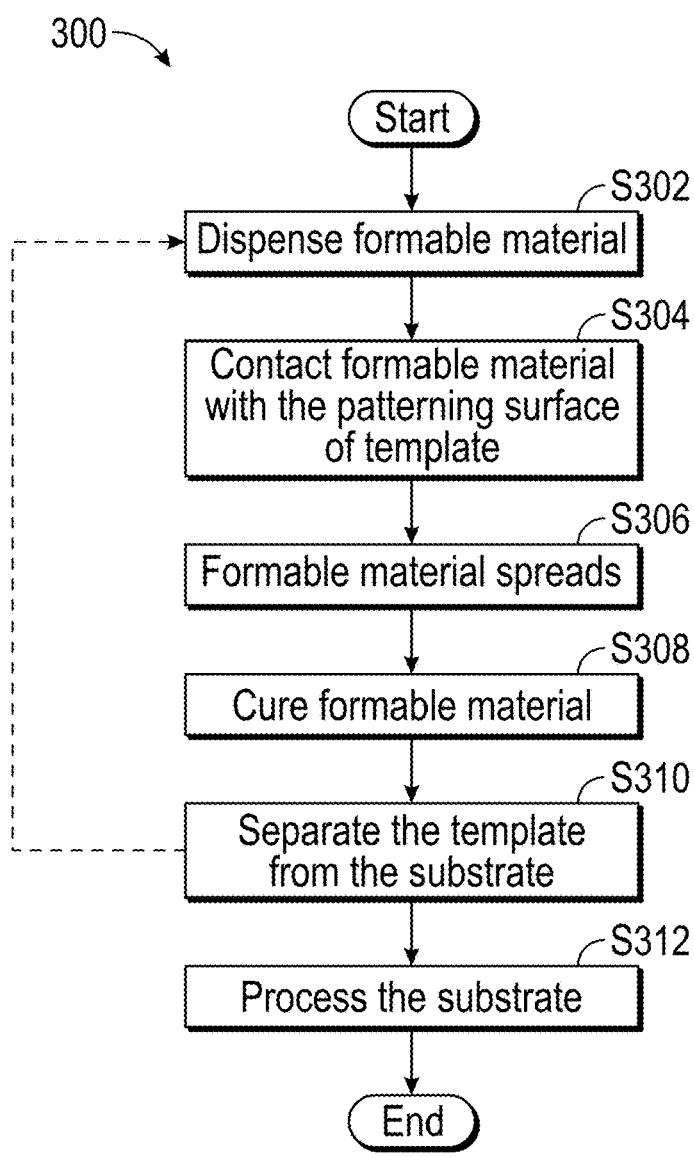
FIG. 3 is a flowchart illustrating an exemplary imprinting method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Drop Dispensing Method

A drop dispensing method by the nanoimprint lithography system 100 or planarization system can be used to dispense a pattern of drops of formable material 124 onto the substrate 102, which is then imprinted/planarized. Imprinting/planarizing may be done in a field by field basis or on a whole wafer basis. The drops of formable material 124 may also be deposited in a field by field basis or on a whole substrate basis. Even when the drops are deposited on a whole substrate basis generating the drop pattern is preferably done on a field by field basis. The drop dispensing method described herein solves the above-noted problem of an RLT delta between different sections of the imprinted/planarized wafer that is too great when using a drop pattern having a combination of different grid patterns.

Generating a drop pattern for a full field may include a processor 140 receiving a substrate pattern of a representative substrate 102, and a template pattern of a representative template 108.

The substrate pattern may include information about substrate topography of the representative substrate, a field of the representative substrate and/or a full field of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape of an edge such as a beveled edge or a rounded n edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed.

The template pattern may include information about the topography of the patterning surface 112 of the representative template. The topography of the patterning surface 112 may be measured and/or generated based on design data. In an alternative embodiment, the template pattern of the representative embodiment is featureless and may be used to planarize the substrate 102. The patterning surface 112 may be the same size as: an individual full field; multiple fields; the entire substrate, or larger than the substrate.

Once the substrate pattern and the template pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material, material properties of the patterning surface, material properties of the substrate surface, spatial variation in volume between the patterning surface and the substrate surface; fluid flow, evaporation; etc.

The term "pitch" used herein is intended to mean a distance from a center of a feature to a center of a next adjacent feature. For a fluid droplet pattern, the pitch is a distance from the center of a droplet or potential droplet position to the center of the next adjacent droplet or next potential droplet position. In other words, the pitch is a constant distance value representing the smallest possible distance between two adjacent drop positions within a drop pattern. In Cartesian coordinates, a two-dimensional droplet pattern (a pattern of droplets as seen from a top or plan view) or a two-dimensional nozzle pattern (a pattern of nozzles as seen from a bottom view of the fluid dispenser) can have a pitch in the X-dimension that corresponds to the distance between the centers of the features as measured in the X-dimension (X-dimension pitch), and a pitch in the Y-dimension that corresponds to the distance between the centers of the features as measured in the Y-dimension (Y-dimension pitch). In this case, the X and Y dimensions in the Cartesian coordinate system are perpendicular to each other. The X-dimension pitch and Y-dimension pitch, as used herein, are described in more detail below.

In imprint lithography/planarization, the formable material needs to be dispensed in a controlled matter to ensure that a proper amount of formable material is dispensed in correct locations and areal densities on the substrate. Available inkjet systems can be tuned to dispense formable material droplets with volumes in the range of 0.1 to 10 picoliters (pL), with 2 pL being an exemplary drop volume. In a typical formable material drop pattern, a 2 pL droplet of formable material occupies approximately 40,000 square microns of the substrate surface. A drop pattern layout for this pattern might consist of 1 droplet for every 40,000 square microns. For example, one drop pattern layout that matches this droplet density specification is a square grid array of droplets with a pitch of 200 microns in both the X and Y dimension. Another drop pattern layout that matches this droplet density specification is a rectangular grid that has a pitch of 50 microns in one dimension and a pitch of 400 microns in a perpendicular dimension. Non-rectangular/non-square grid drop patterns are also routinely used. For example a staggered drop pattern (also known as diamond or interleaved) may be used. An example of a staggered pattern is combining two square grids with a pitch of 200 microns in X and Y, but simply shifting the origins of on the pattern by one-half the pitch, i.e., by 100 microns in both X and Y in this example.

Figure 4A:
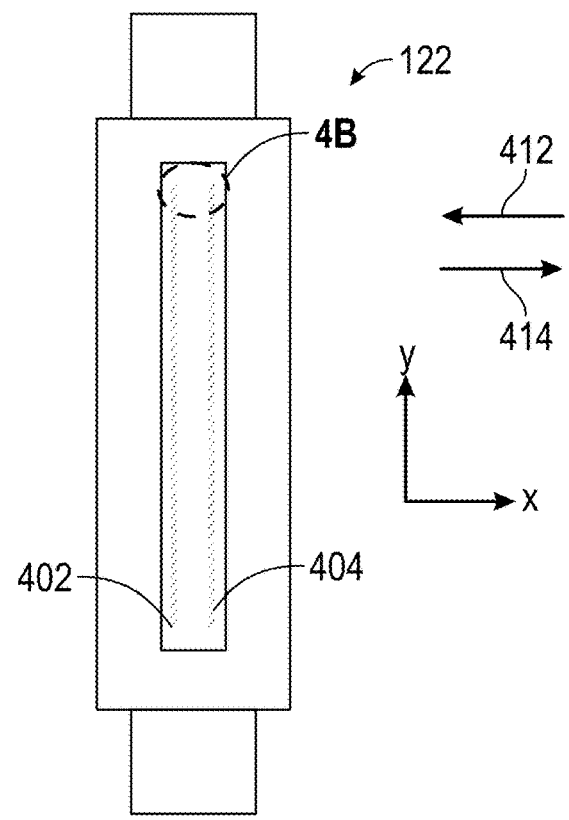
FIG. 4A is a bottom view of an example fluid dispenser in accordance with an example embodiment.

FIG. 4A is a bottom view of an example fluid dispenser 122. As best seen in FIG. 4A, the fluid dispenser 122 may have a first series of nozzles 402 and a second series of nozzles 404. Each series of nozzles 402, 404 includes many nozzles, such as hundreds of nozzles. For example each series of nozzles 402, 404 may include over 500 nozzles. In one example embodiment, 500 nozzles of each series may be available during a dispensing operation with the remaining nozzles not being available. The first and second series of nozzles each have the same number of nozzles.

Figure 4B:
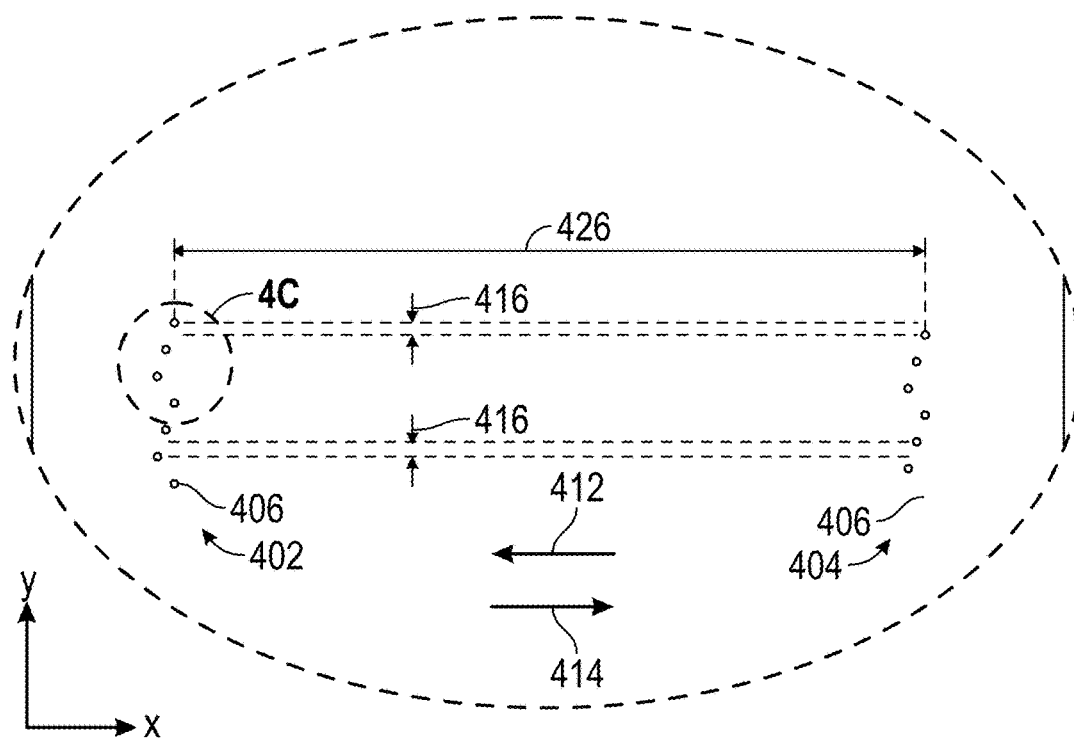
FIG. 4B is an enlarged portion of FIG. 4A.
Figure 4C:
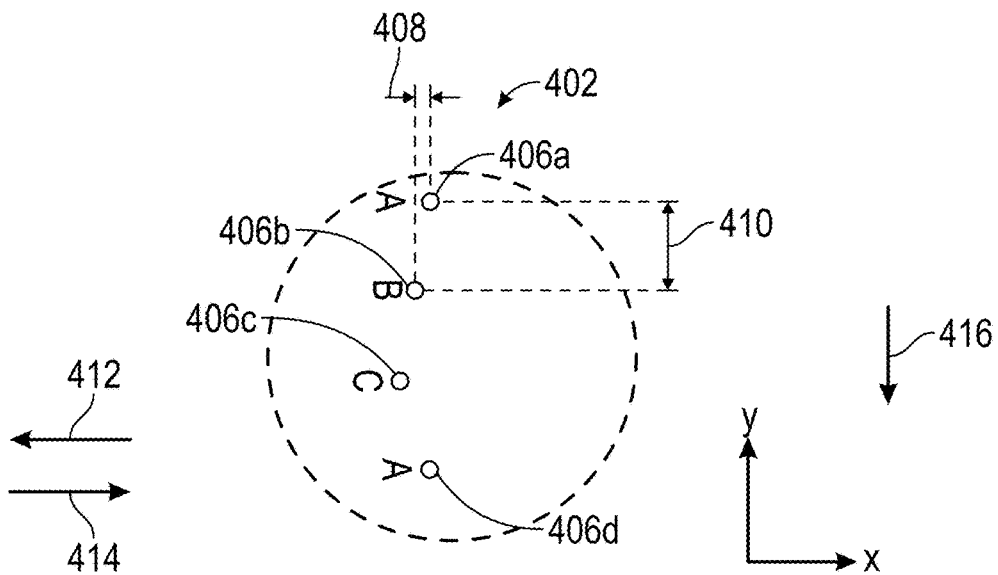
FIG. 4C is an enlarged portion of FIG. 4B.

FIG. 4B is an enlarged portion of FIG. 4A and FIG. 4C is an enlarged portion of FIG. 4B. FIG. 4B shows an enlarged portion of the first series of nozzles 402 and the second series of nozzles 404, such that a plurality of individual nozzles 406 are visible. FIG. 4C shows an enlarged portion of the first series of nozzles 402 only so that individual nozzles 406a, 406b, 406c, and 406d are visible. As referred herein, the "first nozzle" of each series is the topmost nozzle in Y-dimension in the orientation shown in FIG. 4B. The "second nozzle" is the adjacent nozzle appearing immediately below the first nozzle in the orientation shown in FIG. 4B. The same is applicable for the third, fourth, fifth, etc. nozzle. As referred herein, a "corresponding nozzle" means the nozzle number is the same in each series. That is, the first nozzle of the first series of nozzles corresponds to the first nozzle of the second series of nozzles, while the second nozzle of the first series of nozzles corresponds to the second nozzle of the second series of nozzles, and so on.

The X-dimension distance 408 between adjacent nozzles within the series of nozzles is best show in FIG. 4C. As seen in FIG. 4C, adjacent nozzles are offset by the X-dimension distance 408 in sets of three. That is, the nozzles are progressively offset in the X-dimension along a first X-direction 412 for three consecutive nozzles. Every fourth nozzle in the row returns to the same X-dimension position as the first nozzle. Thus, the nozzle 406b is offset by the X-dimension distance 408 in the first X-direction 412 relative to the nozzle 406a, while the nozzle 406c is offset by the X-dimension nozzle 408 in the first X-direction 412 relative to the nozzle 406b. However, as seen in FIG. 4C, the nozzle 406d (i.e., the fourth nozzle in the series) has the same X-dimension position as the nozzle 406a (i.e., the first nozzle in the series). In other words, the nozzle 406c is offset relative to the nozzle 406b by the X-dimension distance 408 in a second X-direction 414 that is the opposite direction to the first X-dimension 412. Thus, the nozzle 406c is offset by two times the X-dimension distance 408 in the first X-direction 412 relative to the nozzle 406a and is also offset by two times the X-dimension distance 408 in the first X-direction 412 relative to the nozzle 406d. Likewise, the nozzle 406a and the nozzle 406d has the same X-dimension offset. The same pattern holds for the entire series of nozzles where the pattern repeats after every third nozzle such that every fourth nozzle has the same X-dimension offset. This pattern of every third nozzle having the same X-dimension position is referred herein as an "A, B, C" repeating pattern, where every "A" nozzle is in same X-dimension position as all other "A" nozzles, every "B" nozzle is in the same X-dimension position as all other "C" nozzles, and every "C" nozzle is in the same X-dimension position as all other "C" nozzles.

The Y-dimension distance 410 between adjacent nozzles within the series of nozzles is best shown in FIG. 4C. As seen in FIG. 4C, the Y-dimension distance 410 between adjacent nozzles is constant throughout the entire series of nozzles. That is, the Y-dimension 410 has the same value for any two adjacent nozzles selected at any point with the series of nozzles. For example, the distance between nozzle 406a and 406b in the Y-dimension is the same as the distance between the nozzle 406b and 406c in the Y-dimension. The same holds true for every adjacent nozzle within each series of nozzles from the first nozzle to the last nozzle.

Returning to the FIG. 4B, the same nozzle layout of the first series of nozzles 402 is present in the second series of nozzles 404. That is, the second series of nozzles 404 similarly starts with a nozzle at a first X-dimension and Y-dimension location, with each adjacent nozzle having the same Y-dimension offset between adjacent nozzles throughout the entire row. The Y-dimension offset between adjacent nozzles in the second series of nozzles 404 is the same as the Y-dimension offset between adjacent nozzles in the first series of nozzles 402. Similarly, the second series of nozzles 404 includes the same pattern of the X-dimension distance in sets of three. Thus, the second nozzle is offset by one X-dimension distance 408 relative to the first nozzle, and third nozzle is offset by the X-dimension distance 408 relative to the second nozzle. But the third nozzle is offset by two times the X-dimension distance 408 relative to the first nozzle. Likewise, the fourth nozzle of the second series of nozzles 404 returns to the same X-dimension position as the first nozzle of the second series of nozzles 404. Thus, as with the first series of nozzles 402, every fourth nozzle of the second series of nozzles 404 has the same X-dimension position.

However, the second series of nozzles 404 differs from the first series of nozzles 402 in that the Y-dimension position of the first nozzle of second series of nozzles 404 is offset relative to the first nozzle of the first series of nozzles 402. Specifically, as shown in FIG. 4B, the first nozzle of the second series of nozzles 404 is offset, relative to the Y-dimension location of the first nozzle 406a of the first series of nozzles 402, in the Y-dimension, by a distance 416 that is one-half of the distance between adjacent nozzles in the Y-dimension (i.e., the distance 416 is one-half of the distance 410 between adjacent nozzles). Because each adjacent nozzle of the second series of nozzles 404 is spaced apart by the same Y-dimension distance 410 as the first series of nozzles 402, and because the first nozzle of the second series of nozzles is offset by a distance 416 that is one-half the distance 410 relative to the first nozzle of the first series of nozzles, every nozzle of the second series of nozzles 404 is also offset by the distance 416 relative to the corresponding nozzle in the first series of nozzles 402. That is, the second nozzle of the second series of nozzles 404 is offset by one-half distance 416 relative to the second nozzle 406b of the first series of nozzles 402, the third nozzle of the second series of nozzles 404 is offset by one-half distance 416 relative to the third nozzle 406c of the first series of nozzles 402, and so on. In other words, if one were to superimpose the second series of nozzles 404 onto the first series of nozzles 402, each nozzle of the second series of nozzles 404 would be located halfway between two nozzles of the first series of nozzles 402 in the Y-dimension.

The above-described geometry of the dispenser 122, along with the ability of the system to move the stage, determines the size of the Y-dimension pitch of dispensed drops. The Y-dimension pitch is a constant distance from the center of a droplet or potential droplet position to the center of the next adjacent droplet or next potential droplet position in Y-dimension. In particular, due to the geometry of the dispenser 122 and the ability of the system to move the stage, the Y-dimension pitch is one-fourth the distance 410 between adjacent nozzles in the Y-dimension. This is because during the dispensing process, the stage carrying the substrate passes underneath the dispenser twice. In the first pass, the stage travels along the X-dimension in the direction 412, during which it is possible for both the first series and the second series of nozzles to dispense fluid. Then, after passing across the dispenser, the stage passes underneath a second time to return to the starting position. In the second pass, the stage travels along the X-dimension in the direction 414, which is opposite the direction 412. During this second pass, the first series and the second series of nozzles can also dispense fluid. Thus, four dispenses are possible during a complete round trip of the stage across the dispenser: 1) first series of nozzles during the first pass, 2) second series of nozzles during the first pass, 3) first series of nozzles during the second pass, and 4) second series of nozzles during the second pass. After the stage finishes the first pass in the direction 412, the stage is shifted by a distance 418 that is equal to one-fourth of the distance 410 in the Y-dimension, and then the second pass in the direction 414 is conducted. Because the second series of nozzles are offset from the first series of nozzles in the Y-dimension by the distance 416 (one-half the distance 410) and because the stage is shifted by the distance 418 that is one-fourth the distance 410 between passes, it is possible for the dispenser to dispense a drop every distance 418 that is equal to one-fourth of the distance 410 along the Y-dimension.

Figure 4D:
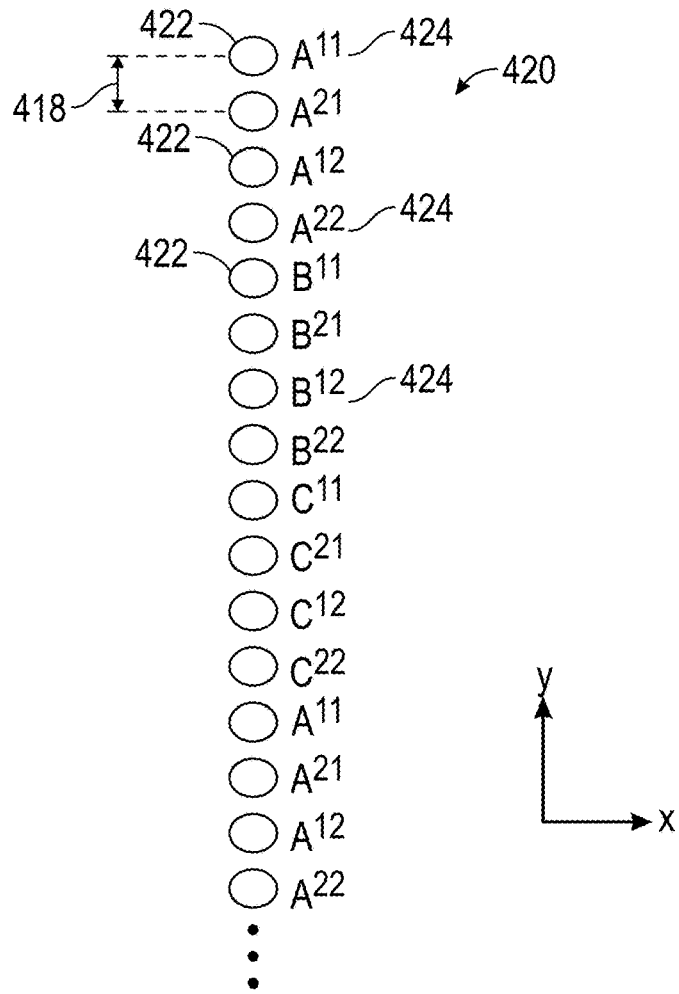
FIG. 4D is a schematic representation of one Y-dimension set of potential drop positions that can be dispensed by a dispenser.

FIG. 4D shows a schematic representation of one set 420 of all possible Y-coordinate drop positions 422 along a single X-coordinate that can potentially be dispensed by both series of nozzles during a round trip pass of the stage. That is, FIG. 4D schematically shows all the possible drop positions at one X-dimension coordinate taking into account both first and second series of nozzles and both passes of the stage. In FIG. 4D, each circle 422 represents a potential position along the Y-dimension in which a drop can be dispensed in a single X-dimension coordinate on the substrate. Each circle is labeled with an identifier 424 having a base letter A, B, or C and a superscript number 11, 21, 12, or 22. The letter A, B, or C corresponds to the notation used in FIG. 4C, where as discussed above, each series of nozzles has a repeating A, B, C structure.

Even though the nozzles are physically offset along the X-dimension to produce the A, B, C arrangement, in one example embodiment, the timing of the dispensing and the movement of the stage along the X-dimension can be precisely controlled such that all of the drops dispensed from the A, B, and C nozzles are vertically aligned despite the offset. That is, all of the A nozzles of the first series of nozzles are dispensed first, then after a predetermined amount of time passes along with movement by the stage, the B nozzles of the first series of nozzles are dispensed, and then after another predetermined amount of time passes along with the movement of the stage, the C nozzles of the first series of nozzles are dispensed. The same A, B, and C dispensing can also be done by the second series of nozzles similarly timed with the movement of the stage. However, in another example embodiment, for certain fabrications, the X-dimension offset does not need to be taken into account because the X-dimension offset is small enough that the offset will not substantially impact the final performance of the manufactured article. Either way, all of the A, B, and C drop positions appear to have the same X-coordinate for purposes of representing the potential drop positions. Furthermore, as seen in FIG. 4B, the second series of nozzles 404 is located at a distance 426 from the first series of nozzles 402 along the X-dimension. The controller may precisely control the timing of the dispensing and the timing of the movement of the stage such that when dispensing a particular set 420 of Y-coordinate drops, the drops being dispensed from the second series of nozzles 404 have the same X-dimension value as the drops dispensed from the first series of nozzles 402, despite the distance 426. Thus, all of the drop positions to be dispensed from the first series of nozzles 402 and the second series of nozzles 404 appear in a straight vertical line (i.e., all having the same X-dimension coordinate). In another example embodiment, the dispenser can move and the stage can be stationary. In this embodiment the controller may control movement of the dispenser in the same manner described above with respect to the stage.

The superscript number in the identifier 424 indicates from which series of nozzles (first or second) and during which pass (first or second), the particular drop will be dispensed. The first number of the superscript refers to which pass, where "1" refers to the first pass and "2" refers to the second pass. The second number refers to which series of nozzles, where "1" refers to the first series and "2" refers to the second series. Thus, "11" represents first pass/first series, "21" represents second pass/first series, "12" represents first pass/second series, and "22" represents second pass/second series. Accordingly, as shown in FIG. 4D, due to the geometry of the nozzles and the shifting of the stage between passes, the distance 418 between two adjacent dispensing positions in the Y-dimension (i.e., the Y-dimension pitch) is equal to one-fourth of the distance 410 between two adjacent nozzles.

While FIG. 4D shows one set 420 of potential Y-coordinate drop positions along a constant X-coordinate, the dispenser can dispense many sets of Y-coordinate drops at different X-coordinates as the substrate passes across the dispenser along the X-dimension. Furthermore, the set 420 in FIG. 4D shows less potential drop positions than would actually be available. In view of there being two series of nozzles each having on the order of 500 nozzles, and there being two passes of the stage, the actual number of potential drop positions in one set 420 is on the order of 2000 positions. All of these potential sets 420 spread across one field represents all of the potential drop positions in the field in the X and Y dimensions.

With regard to the X-dimension pitch 428 (i.e., the distance between two adjacent potential drop positions along the X-dimension in a drop pattern), the X-dimension pitch 428 is controlled by the timing of the dispensing of the droplets and the timing of the movement of the stage in the X-dimension across the dispenser. That is, the X-dimension pitch 428 is not tied to the geometry of the dispenser as the Y-dimension pitch is. In one example embodiment the timing of the movement of stage is coordinated with timing of the dispensing by the controller so that the X-dimension pitch 428 is equal in distance to the Y-dimension pitch. While the X-dimension pitch 428 and the Y-dimension pitch 418 may be made equal for simplicity of generating drop patterns, it is possible for the X-dimension pitch 428 to be greater than or smaller than the Y-dimension pitch 428. As noted above, in another embedment the controller may control movement of the dispenser in the same manner described above with respect to the stage, with the stage being stationary.

Figure 5:
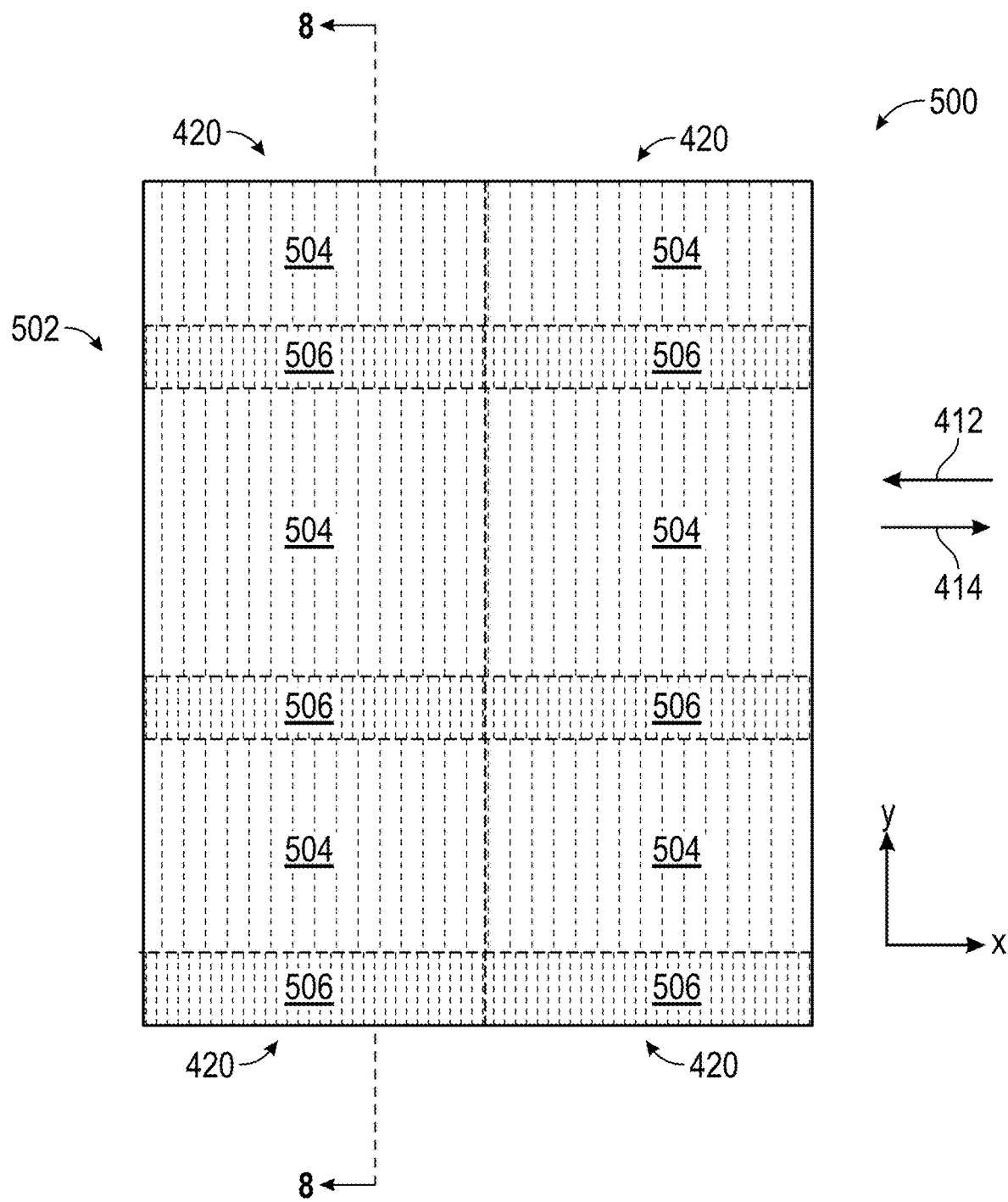
FIG. 5 is a top down view of an example imprint field in which a drop pattern comprising a plurality of grids have been overlaid in accordance with an example embodiment.

As noted above, the imprinting/planarizing process may be done repeatedly in a plurality of imprint fields that are spread across the substrate surface 130. FIG. 5 is a top down view of an example imprint field 500 in which a drop pattern 502 comprising a plurality of grids 504, 506 have been overlaid. That is, FIG. 5 illustrate an example embodiment of an imprint field in which a drop pattern 502 is defined by a plurality of grids 504, 506. In the example drop pattern 502 shown in FIG. 5, the drop pattern 502 includes a first grid 504 and a second grid 506. The first grid 504 represents a particular sub-pattern of drops while the second grid 506 represents a different sub-pattern of drops of the overall drop pattern 502. As also seen in FIG. 5, the first grid 504 and the second grid 506 alternate along the Y-dimension. That is, starting at the uppermost edge of the imprint field 500 in the Y-dimension, the uppermost grid is the first grid 504. Then, the adjacent grid along the Y-dimension just below the uppermost grid is the second grid 506. The grids then continue to alternate between the first grid 504 and the second grid 506 along the Y-dimension, ultimately ending with the bottommost grid being the second grid 506. Along the X-dimension, in the example shown in FIG. 5, the grids are the same. That is, from the leftmost side of the field of view 500 to the rightmost side in the X-dimension, the grid does not change. FIG. 5 is thus an example of a field in which two types of different grid patterns are used to form the overall drop pattern 502. By using a combination of different grids, the system is able to optimize dispensing to account for the particular topography of a substrate on which the drops of formable material are dispensed. The drop pattern 502 essentially comprises many (e.g., hundreds) of side-by-side sets 420 of Y-coordinate drops (i.e., spanning the X-dimension), where each set 420 has drops designated to drop at certain positions along the Y-dimension.

Figure 6A:
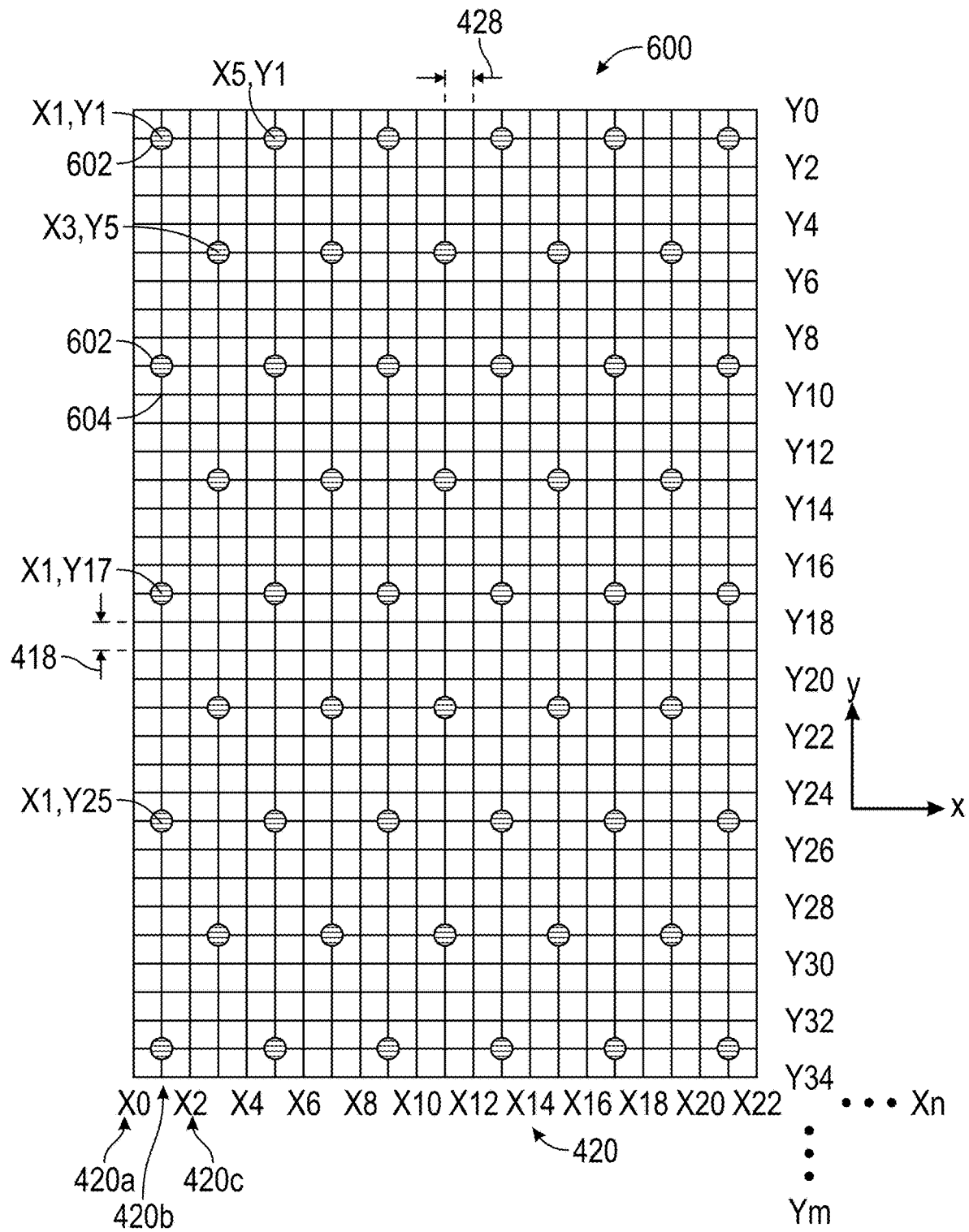
FIGS. 6A and 6B show example grid patterns that may be used to form a drop pattern in accordance with an example embodiment.
Figure 6B:
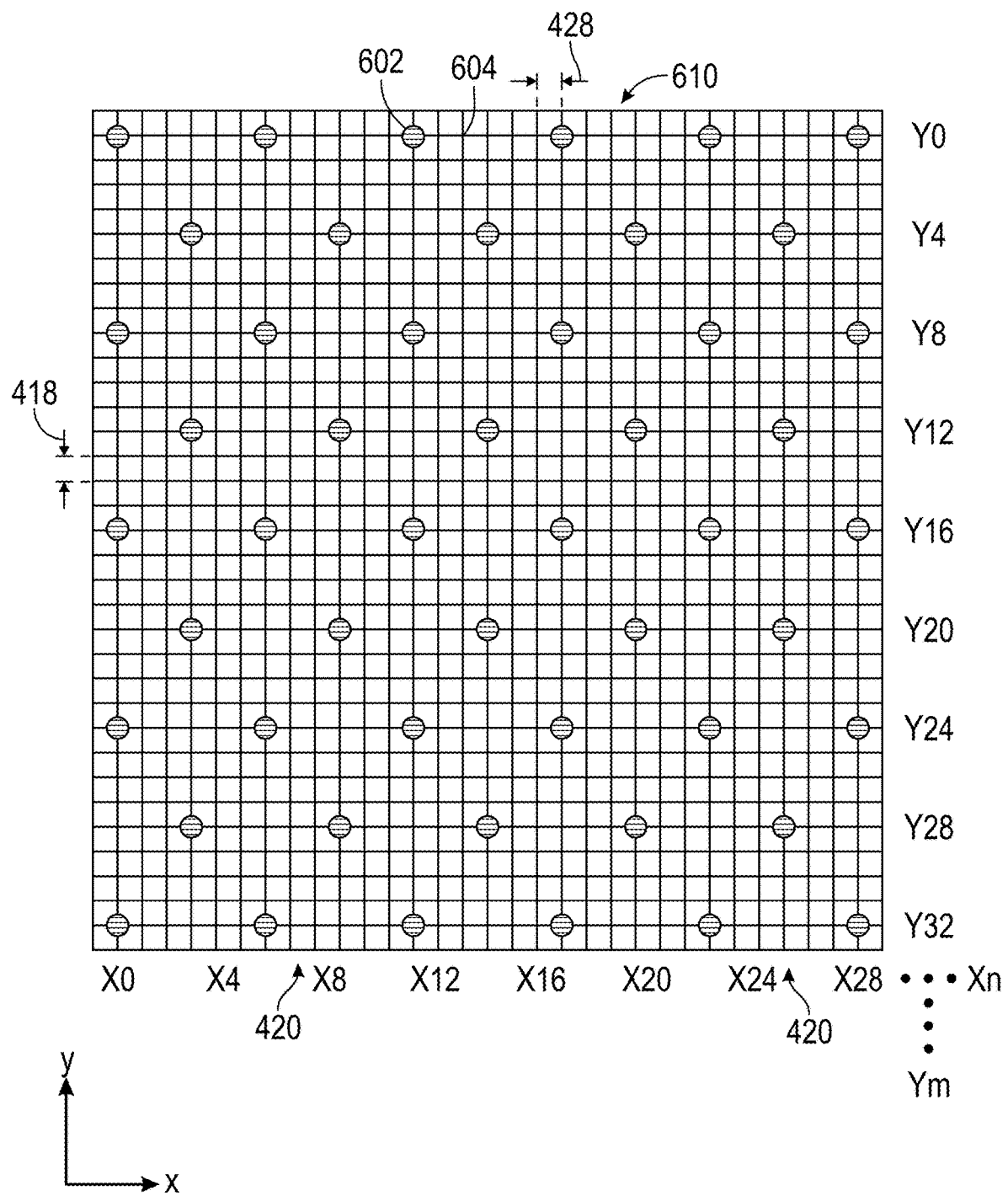

FIGS. 6A and 6B show example grid patterns 600, 610, that can be used in an imprint field. Each of the grid patterns 600, 610, indicate the position of a nozzle for which a drop 602 will be dispensed and a position of a nozzle where a drop will not be dispensed 604 in an X-Y grid corresponding to X-Y coordinates on the imprint field. The intersection point of the horizontal and vertical lines in each grid represent a potential location in which a drop can be dispensed on the imprint field based on the geometry of dispenser, the timing of the dispensing, and the movement of the stage, as described above with respect to FIG. 4A to 4D. Each of the grid patterns 600, 610, essentially comprises a plurality of side-by-side sets 420 from FIG. 4D.

Each of the grid patterns 600, 610, is expressed as a two-dimensional plane having the same X and Y dimensions as the imprint field 500. All of the possible drop positions can be defined by an X and Y coordinate. For example, as shown in FIG. 6A, the uppermost left dispensing position may be designated as coordinates X0 and Y0. Every dispensing position in the first set 420a would be designated the X0 position, while every dispensing position extending along a horizontal line starting from the X0 position would be designated the Y0 position. Moving one column over from the initial position, every dispensing position along the second set 420b would be in the X1 position. Moving one row down from the initial position every dispensing position along the second horizontal line would be in the Y1 position. Two positions over in the horizontal direction from the origin position is the third set 420c, where all of the drop positions are in the X2 position. In this manner, every potential dispensing position can be identified by an X coordinate and Y coordinate. FIG. 6A shows some examples of various coordinates in which a drop 602 has been designated to be dispensed. Specifically, positions X1, Y1; X5, Y1; X3, Y5; X1, Y17; X1, Y25 have been labeled in FIG. 6A and have a drop 602 at that position. While only a few example drops have been labeled, every drop designated position and every non-drop position 604 can be designated with an X and Y coordinate. Furthermore, while FIG. 6A shows 22 X positions (i.e., X0 through X22) and 34 Y positions (i.e., Y0 through Y34), there may be many more X and Y position as indicated by Xn and Ym, where m and n can be on the order of hundreds. The same is applicable to the grid pattern shown in FIG. 6B.

As discussed above, due to the geometry of the dispenser, the timing of the dispensing, and the movement of the stage or dispenser, each dispensing point along any particular set 420 will be dispensed from one of: a) the first series of nozzles during the first pass, b) the second series of nozzles during the first pass, c) the first series of nozzles during the return pass, or d) the second series of nozzles during the return pass. Because the grid pattern defines certain drop locations along the Y-dimension, certain grid patterns will require one or more of conditions (a) to (d) to dispense all of the drops. That is, in certain drop patterns all of the drop positions can be dispensed by the first series of nozzles in the first pass (i.e., condition (a)), while other grid patterns have drop positions that will require both the first series of nozzles on the first pass and the second series of nozzles on the first pass (i.e., condition (b)). Other grid patterns will have drops that require the second pass to be dispensed using one or both of the series of nozzles. That is, each grid pattern will use some combination of the possible positions shown in FIG. 4D.

Figure 7A:
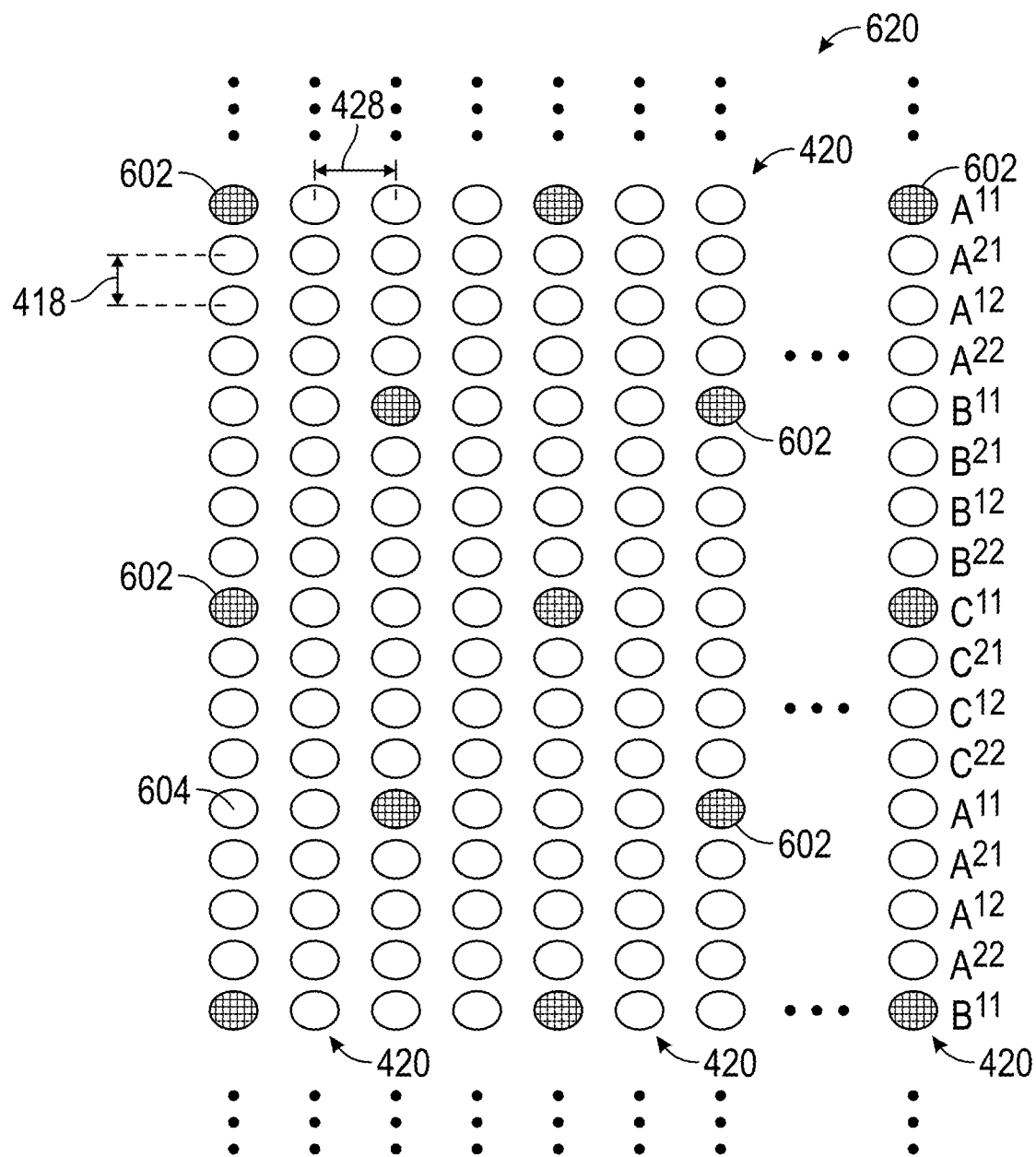
FIG. 7A shows a series of Y-dimension sets of drops corresponding a portion of the grid pattern shown in FIG. 6A.
Figure 7B:
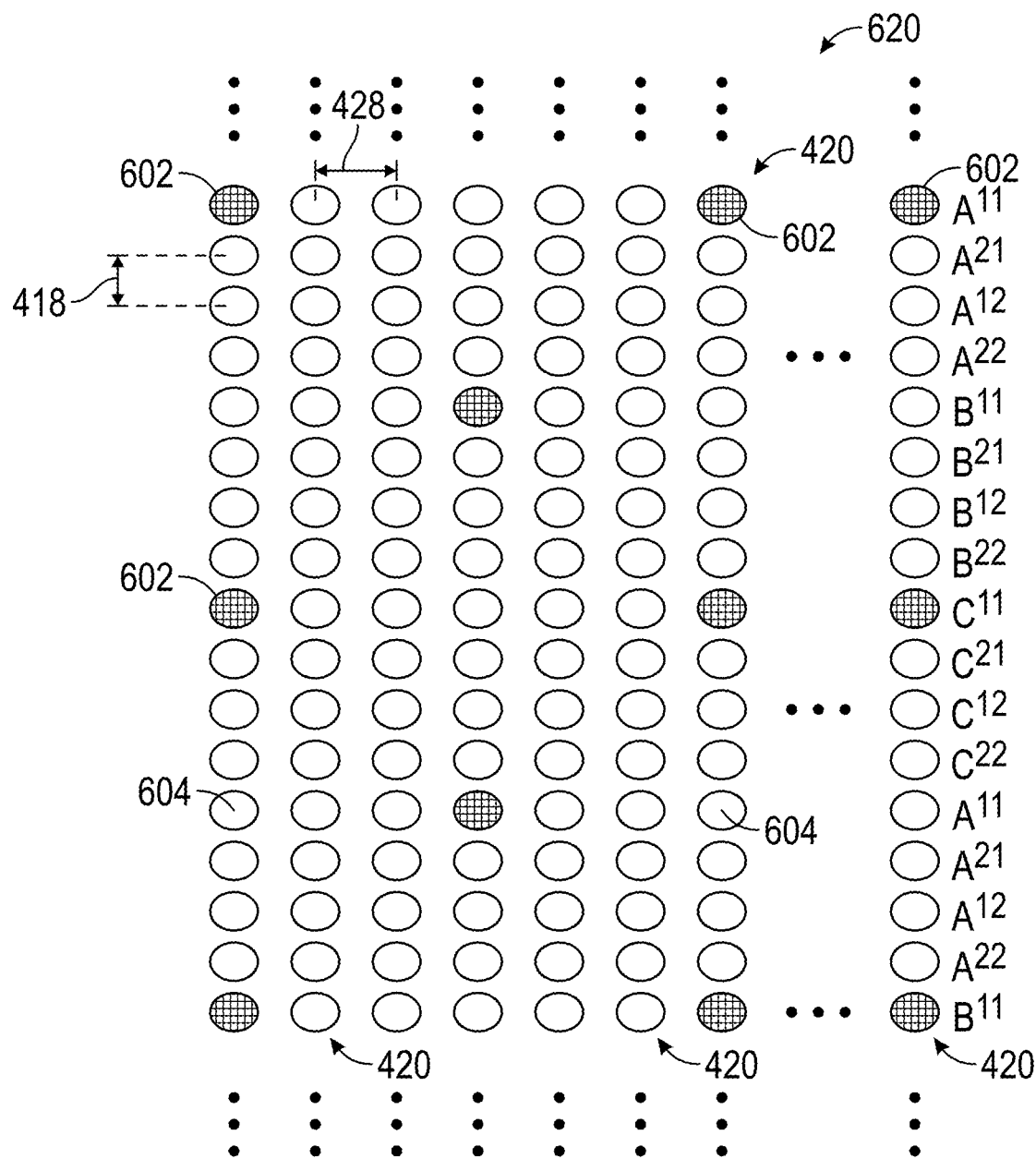
FIG. 7B shows a series of Y-dimension sets of drops corresponding to a portion of the grid pattern shown in FIG. 6B.

FIG. 7A shows a series of sets 420 of drops 602 corresponding to a portion of the grid pattern 600 shown in FIG. 6A. That is, a portion the grid pattern 600 of FIG. 6A has been applied to the potential dispensing positions explained above with respect to FIG. 4D. As seen in FIG. 7A, when the grid pattern 600 is applied to the dispensing positions, positions $A^{11}$, $B^{11}$, and $C^{11}$ are being used (i.e., are designated with a filled-in circle representing drop 602). Accordingly, in order to dispense the grid pattern 600, only the first series of nozzles in the first pass will be used. FIG. 7B shows a series of sets 420 of drops 602 corresponding to a portion of the grid pattern 610 shown in FIG. 6B. That is, a portion the grid pattern 610 of FIG. 6B has been applied to the potential dispensing positions explained above with respect to FIG. 4D. As seen in FIG. 7B, when the grid pattern 620 is applied to the dispensing positions, the same positions $A^{11}$, $B^{11}$, and $C^{11}$ are being used. However, in the grid pattern 620, every third set 420 have drops, while in the grid pattern 610, every other set 420 has drops. Thus, while only the first row and first pass is used to dispense the drops of both patterns, the grid pattern 620 is less dense than the grip pattern 610.

As demonstrated above in FIGS. 7A and 7B, when the Y-dimension spacing of drops of a grid is divisible by 4 (i.e., the drops are spaced in Y-dimension every 4 dispensing positions, every 8 dispensing positions, every 12 dispensing positions, every 16 dispensing positions, etc.), then all of the drops will be dispensed during the same pass of the substrate and using only one of the series of nozzles. In the particular examples shown in FIGS. 7A and 7B, the drops are designated at every 8 dispensing positions in the Y-dimension and only on first nozzle series/first past positions ($A^{11}$, $B^{11}$, or $C^{11}$ positions) because the initial drop to be dispensed is located at a first nozzle series/first pass position. The same principle is applicable to the second series and second pass as well. That is, if the initial drop to be dispensed is located on a first nozzle series/second pass dispensing position, and the drops are located at every fourth, eighth, twelfth, etc. dispensing positions, then the drops will all be dispensed by the first nozzle series/second pass. The same is true when the first drop to be dispensed is located at the second nozzle series/first pass and second nozzle series/second pass.

While FIGS. 6A and 6B show two example grid patterns, a wide variety of grid patterns can be prepared. FIG. 6A shows a pattern where each set 420 of drops in the Y-dimension has drops located at every eighth position. With respect to the X-dimension, every other X coordinate is skipped, such that every other set 420 has no drops. Furthermore, the pattern in FIG. 6A has a single stagger in every other set 420 of drops is shifted by four dispensing positions in the Y-dimension relative to the other sets. Similarly, FIG. 6B shows a pattern where each set 420 of drops in the Y-dimension has drops located at every eighth position. However, with respect to the X-dimension, two X coordinates are skipped between sets 420, such that every third set 420 has drops. Furthermore, as with FIG. 6A, the pattern in FIG. 6B has a single stagger in that every other set 420 of drops is shifted by four dispensing positions in the Y-dimension relative to the other sets. Other patterns may be used such as, instead of a drop being designated at every third position in the X-dimension and every eighth position in the Y-dimension, the drops can be positioned at every second, third, fourth, fifth, sixth, seventh, eighth etc. position in the X-dimension and every fourth, eighth, twelfth, sixteenth etc. position in the Y-dimension. Furthermore, instead of having a single stagger as in FIGS. 6A and 6B, some patterns can have no stagger, have a double stagger, or a triple stagger. A pattern with no stagger is known as a box pattern. In a box pattern, there is no shifting of the drops along the Y-dimension for adjacent sets. In a double staggered pattern, there is a progressive shifting of the drops in the Y-dimension where every third set of drops is the same, with two sets of drops being progressively shifted for each group of three Y-dimension sets. In a triple staggered pattern, there is a progressive shifting of the drops in the Y-dimension where every fourth set of drops is the same, with three sets of drops being progressively shifted for each group of four Y-dimension sets. Thus, particular grid patterns can be customized based on the dispensing needs of a particular fabrication. Whatever grids are selected based on the needs of the particular fabrication, the grids can instruct the dispensing of drops on the imprint field using the appropriate series of nozzles (first or second) and appropriate pass of the stage (first or second) depending where the drops are designated along the Y-dimension.

Returning to FIG. 5, as noted above, a plurality of grid patterns are shown being used in single field, in combination. That is, as shown in FIG. 5, the grid patterns across the field in the Y-dimension alternate between a first pattern 504 and a second pattern 506. The dispenser is able to dispense the entire field 502 in one dispensing cycle. For the reasons discussed above, the Y-dimension length of the overall field is essentially limited by four times the length of one series of nozzles. The same principle described above for the dispensing of a grid is applied to the entire field 502. For example, as described above, the first and/or second series of nozzles can dispense the drops during the first and/or second pass of the stage depending on the drop positions. As shown in FIG. 5, because a single set 420 of drops spans multiple different grids, the same series of nozzles can dispense different spacing of drops depending on which grid is being dispensed at that moment. For example, for a particular set 420 of drops, a first portion of nozzles of the series nozzles may dispense drops according to the first grid 504, a second portion of nozzles of the series of nozzles may dispense drops according to the second grid 506, a third portion of nozzles of the series of nozzles may dispense drops according to the first grid 504, and so on. Thus, in this manner, a plurality of grids can be dispensed in a single field, i.e., in a single round trip passage of the substrate. While only two different types of grids are shown in FIG. 5, it should be understood that other combination of grids can be used, such as using three or more unique patterns. Also, the size of each grid pattern can be modified such that a particular grid covers more or less of field in the X or Y dimension. Customizing which grid patterns are used and customizing the sizes of the grid patterns in single field allows for a wide variety of precisely controlled patterns within the field.

Figure 8:
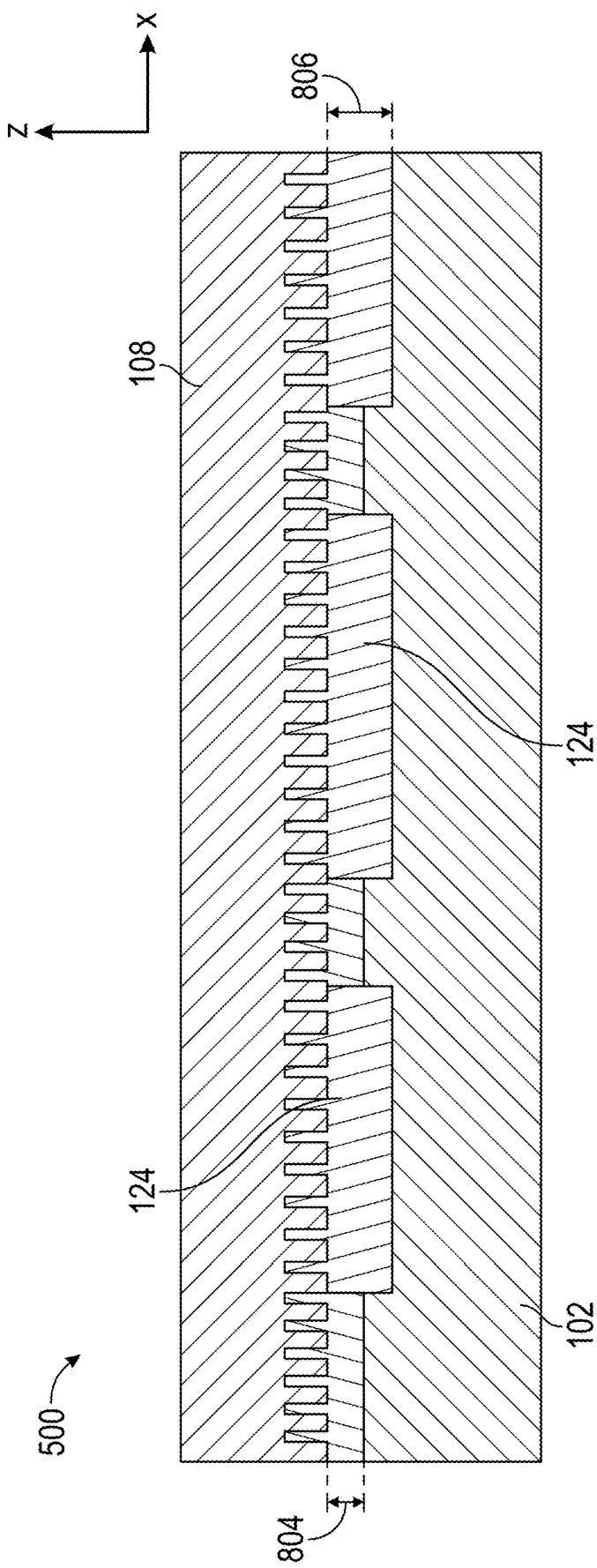
FIG. 8 is a cross section of an imprint field taken along line 8-8 of FIG. 5 in accordance with an example embodiment.

When a combination of different grid patterns are used in a single field, there will be a difference in the residual layer thickness (RLT) between the sections of the substrate in which different grid patterns were used to dispense the formable material. FIG. 8 is a cross section of an imprint field 500 taken along line 8-8 of FIG. 5 after the formable material 124 has been dispensed according to the grid patterns 504, 506 and after the template 108 has contacted the formable material 124 on the substrate 102. As shown in FIG. 8, in an example embodiment, the RLT 804 of the formable material 124 dispensed according to the first grid pattern 504 is smaller than the RLT 806 of the formable material 124 dispensed according to the second grid pattern 806. The difference in RLT between two adjacent portions of dispensed formable material that have been dispensed using two different grid patterns is referred herein as "RLT delta." That is, RLT delta is equal to the absolute value of the RLT of a first portion of formable material dispensed according to a first grid pattern minus the RLT of a second portion of formable material dispensed according to a second grid pattern that is adjacent the first portion. When the first grid pattern and the second grid pattern are different, there will be a non-zero RLT delta.

As is understood in the art, depending on the particular type of dispenser, the volume of the drops being dispensed by the nozzles may be controlled by directly controlling the current, voltage, or charge, or indirectly via a digital signal that instructs the change of the current, voltage, or change. For example, for a piezoelectric inkjet, by changing the voltage applied to the dispenser, the piezoelectric ink jetting will have larger or smaller volume drops. In the jetting system described herein, the voltage can only be applied to each series of nozzles versus particular nozzles within the series. That is, it is limitation of the system that a first voltage can be applied to the first series of nozzles (i.e., such that all of the nozzles being used in the first series will dispense the same volume drops) while a second voltage can be applied to the second series of nozzles (i.e., such that all of the nozzles being used in the second series will dispense the same volume of drops). Thus, when operating the dispensing system, the first voltage can be the same or different from the second voltage. Accordingly, the volume of the drops dispensed form the first series of nozzles can be different from the volume of the drops dispensed from the second series of nozzles. Thus, in a case where all of the drops are dispensed from the first series of nozzles (i.e., a case where all of the grid patterns being dispensed have drop positions such that only the first series of nozzles are used, e.g., the patterns shown in FIGS. 6A and 6B), all of the drops will be dispensed at the same volume regardless of which grid pattern is being dispensed. In this case, because all of the drops are dispensed by one series of nozzles, when dispensing the entire field, all of the drops of both patterns will be dispensed at the same volume and therefore the RLT delta between the dispensed grid patterns will end up being a particular fixed value. However, in some cases, the resulting RLT delta does not match the underlying topography of the substrate. This may be particularly true when the adjacent grid patterns are widely different from each other, for example, when the first pattern is many times more dense than the second pattern (e.g., if the first pattern is a "2×4" pattern and the second pattern is a "8×16" pattern)

As known in the art, a particular drop pattern for a particular dispenser will have a unique calibration curve that correlates drop volume and RLT with voltage. Each dispenser has its own calibration curve based on a variety of factors, including ambient temperature, ambient pressure, humidity, temperature of ink, ink supply pressure, meniscus pressure, age of the ink, etc. That is, for each drop pattern dispensed by a particular dispenser, a unique calibration curve can be generated through routine experimentation. This is achieved by dispensing a particular grid pattern with the dispenser repeatedly, where different voltages are applied during different dispenses, with the above factors kept constant. That is, all of the process parameters are kept constant with the only the voltage being changed. The calibration curves may be generated with a featureless template and substrate. The calibration curves of multiple grid patterns for a particular voltage can be established in single dispensing on the same substrate by dispensing each grid pattern in its own separate filed. The RLT is then measured many different times (e.g., a hundred or more times) within each field, after curing the formable material, using an optical microscope, atomic force microscope, or a scanning electron microscope The average RLT may be calculated for each pattern at each voltage. The recorded average RLT values may be plotted against the corresponding applied voltage, and a best-fit curve can be generated using the data points. The generated curve represents what RLT will be produced when the same pattern is dispensed using a particular voltage via the same dispenser and conditions.

Figure 9:
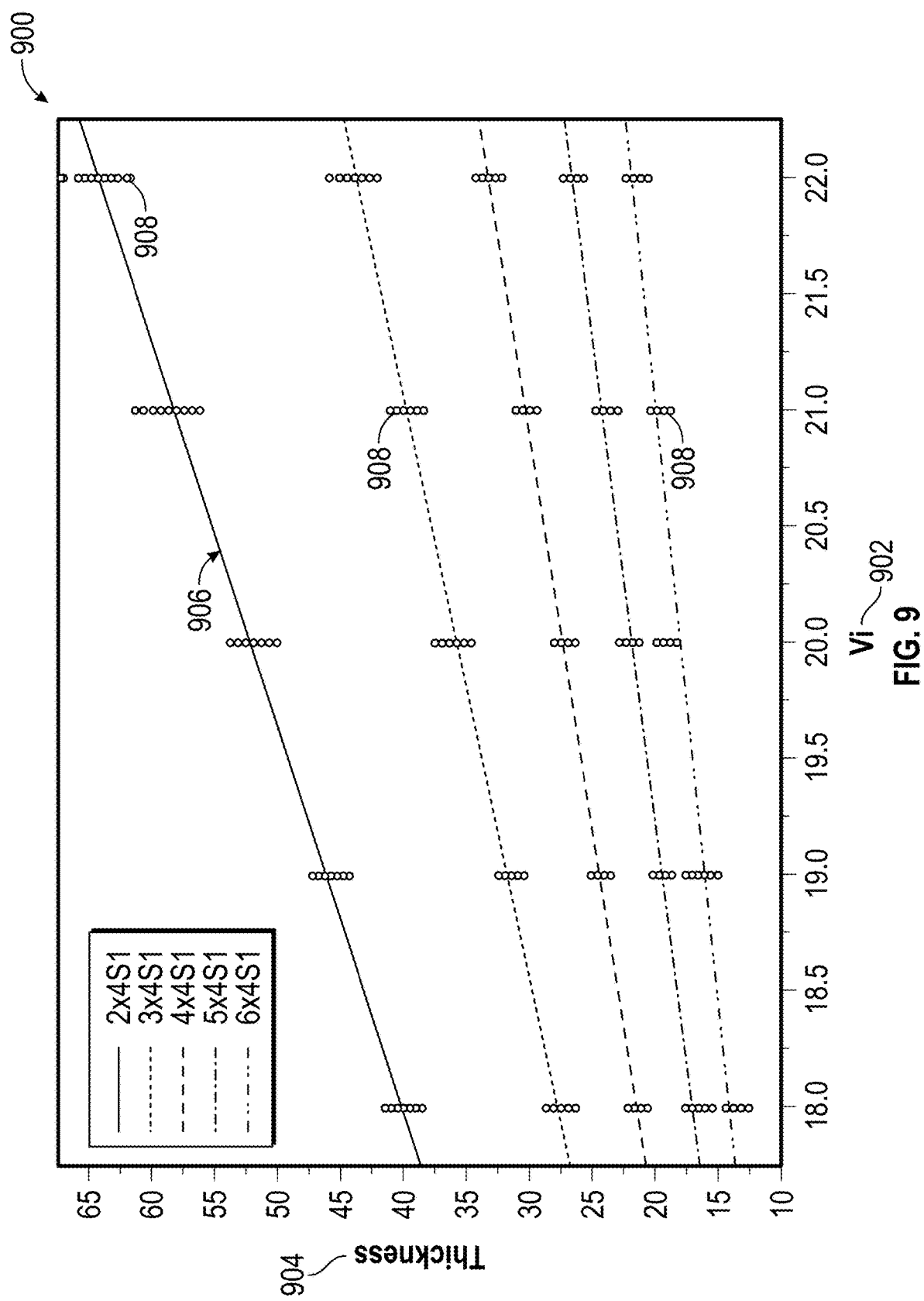
FIG. 9 is an example RLT/voltage calibration chart for a variety of grid patterns.

FIG. 9 shows an example of multiple calibration curves on a single chart 900 for a variety of grid patterns. In FIG. 9, the X-axis represents voltages 902 in volts and the Y-axis represents RLT thickness 904 in nanometers. Each of the lines 906 in the chart represent a calibration curve for a different grid pattern. Each of the lines 906 are best fit lines fitted through the average RLT data point 908 after measuring many RLT thicknesses for a given voltage. In the example shown in FIG. 9, eight different grid patterns of different density have been charted. The topmost line is the least dense grid pattern and the bottom line is the most dense grid pattern. Having a RLT/voltage calibration curve for each grid pattern allows for determining what grid pattern and what voltage should be used for a particular dispensing operation, as described below.

Figure 10:
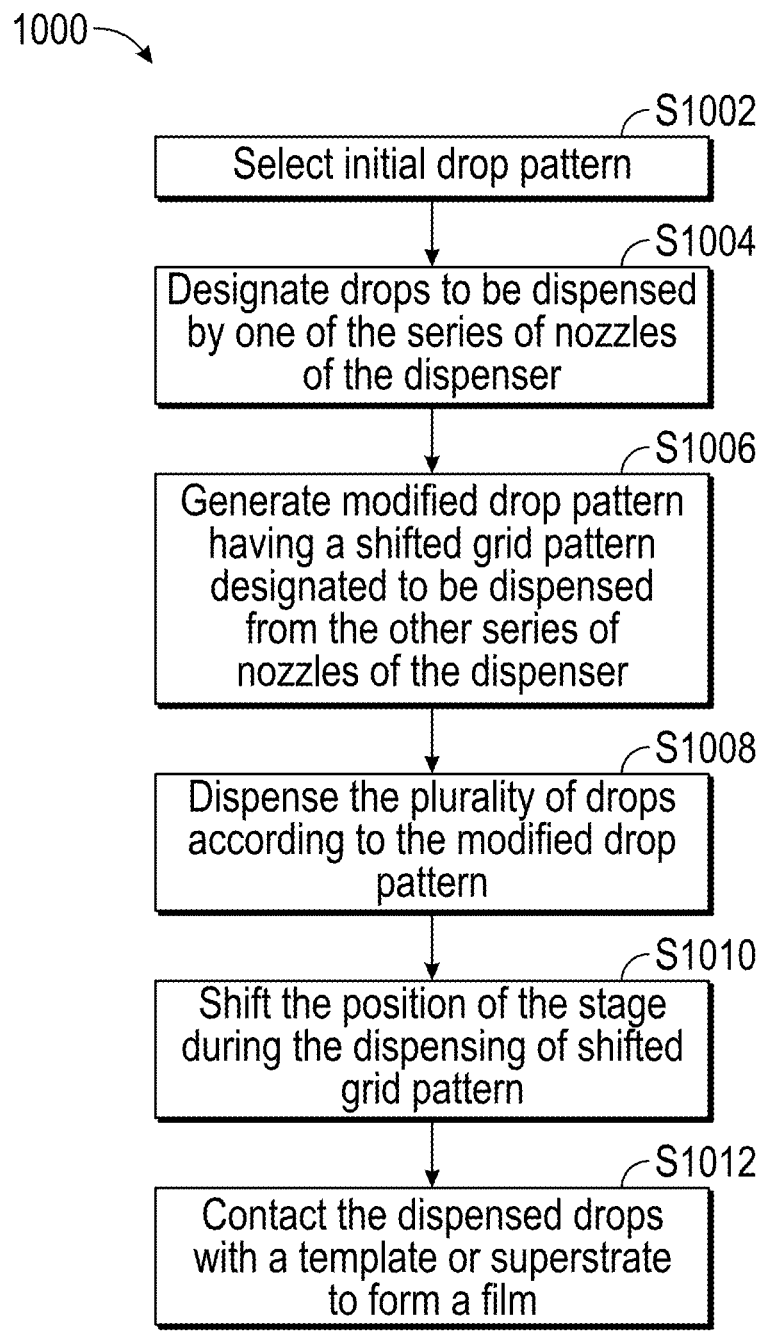
FIG. 10 is a flowchart of an example fabrication method in accordance with an example embodiment.

FIG. 10 is a flowchart of an example fabrication method 1000. The fabrication method 1000 begins with a first step S1002 of selecting an initial drop pattern. The initial drop pattern is the desired pattern of the drops to be dispensed onto the substrate. In other words, the initial drop pattern is a placement pattern that represents the predetermined ideal location of the drops on the substrate, prior to modifying the drop pattern to achieve a RLT delta closer to ideal. More particularly, the initial drop defines a position of drops of the formable material in a two-dimensional plane having an X-dimension and a Y-dimension, where the initial drop pattern comprises the grid pattern of drops. As noted above, the grid pattern defines a spacing between the drops in the Y-dimension and the X-dimension. The grid pattern has an initial position within the plane. For example, the pattern shown in FIG. 5 can be considered to be an initial drop pattern where a plurality of grids are shown in their initial position. The initial position is defined as the position of the first drop in the dispensing order (i.e., the drop that will physically be dispend first when the dispensing begins), with all of the drops having an initial position relative to the designated position of the first drop. For example, the position of the first drop in the dispensing order may be considered to have a coordinate of "X1, Y1" in the Cartesian coordinate system, with the initial position of all of the other drops having X and Y coordinates relative to X1, Y1. In an example embodiment, the first drop in the dispensing order is designated to a position that will dispensed by the first series of nozzles and on the first pass (i.e., one of positions $A^{11}$, $B^{11}$, $C^{11}$ of FIG. 4D). In the example shown in FIG. 5, two different grid patterns 502, 504 are illustrated and each grid is located at an initial position.

Obtaining/generating an initial drop pattern comprising grids may be performed using any known technique or future developed technique, as the drop dispensing method described herein is independent of the particular manner in which the initial drop pattern is determined. That is, the drop dispensing method described herein can be performed using any initial drop pattern having grids, regardless of how the drop pattern has been developed. An example of generating a drop pattern having grids is found in U.S. Pat. No. 9,651,862, although a combination of different grids is not described. The step of obtaining the initial drop pattern generally includes first receiving feature information representing the topography of the substrate and the template using techniques known in the art. GDSII (graphic data system) and OASIS (Open Artwork System Interchange Standard) format is commonly used in the art to represent the topographies. Next, a desired spatial distribution of volume of the topography for a given average RLT based on the received feature information is calculated. Then, a spatial distribution of drops that has a spatial volume distribution that is approximately equal to the desired spatial distribution is determined. The determination of the spatial distribution may take into account fluid flow, non-uniform template contact, and orientation of features that influences the spread of droplets. Because the steps of obtaining of the initial drop pattern in known in the art, further details are omitted herein. As noted above, as known in the art, the initial drop pattern may be defined by a plurality of different grids.

After determining the appropriate combination of grid patterns that will be used to dispense the drops across the field, the method proceeds to step S1004 where the drops of the grid pattern are designated to be dispensed by one of the series of nozzles (i.e., the first series of nozzles or the second series of nozzles) of the dispenser based on the spacing between drops along the Y-dimension and based on the initial position. That is, as discussed above, prior to any pattern adjustment, certain grid patterns are designated to be dispensed from only one of the nozzles depending on the Y-dimension spacing between the drops.

Prior to step S1006 discussed below, as discussed above, the method may further include using the RLT/voltage calibration curve for each grid pattern to determine what voltage would have been applied to achieve an RLT as close as possible to the desired RLT in the section of the field. However, as noted above, during a single dispensing, the voltage of the first series of nozzles is constant and the voltage of the second series of nozzles is constant. Thus, when a single series of nozzles dispenses different patterns in the field, the RLT delta between two different sections of the field having different grid patterns may be too far from ideal. In other words, even when using the RLT/voltage calibration curves to select the voltage, when one series of nozzles dispenses different grid patterns, there will still be areas in the field where the RLT delta could benefit from further compensation toward ideal RLT delta. Thus, the voltage determined in this step will not actually be applied to the dispenser. Rather, the voltage determination may be used to determine which sections of the field are in need of further compensation toward ideal delta RLT. This step may further include selecting a subset of sections that have the greatest need for compensation as compared to other sections. The reason for this is that based on the geometry of the grid patterns being dispensed, it is possible that only certain sections can receive further compensation. In such cases, prioritizing the section in most need of compensation will provide better results if it is not possible for all of the sections needing compensation to be modified.

Next, the method proceeds to step S1006, where a modified drop pattern is generated. The modified drop pattern is generated by shifting the grid pattern in a first direction along the Y-dimension from the initial position to a shifted position. The shift distance between the initial position and the shifted position is selected such that the drops of the shifted grid pattern are designated to be dispensed from the other series of nozzles of the dispenser. That is, if the grid pattern was designated to be dispensed by the first series of nozzles in step S1004, then the grid pattern is shifted along the Y-dimension by an amount that will result in the grid pattern being dispensed by the second series of nozzles instead. The opposite may also be true, in which a pattern originally designated for the second series of nozzles can be shifted to be dispensed from the first series of nozzles instead. It should be understood that as used herein "first" and "second" in reference to the series of nozzles is arbitrary and either series can be considered the first or second series of nozzles. In another example aspect, in addition to or instead of shifting the grid pattern such that it is dispensed from the other series of nozzles, the amount of shifting can be selected such that the grid pattern is dispensed on the other pass of the substrate via the stage. That is, if the grid pattern is designated to be dispensed on the first pass (or the second pass) of the stage, the shifting can be selected such that the grid pattern will be dispensed on the second pass (or the first pass).

Figure 11A:
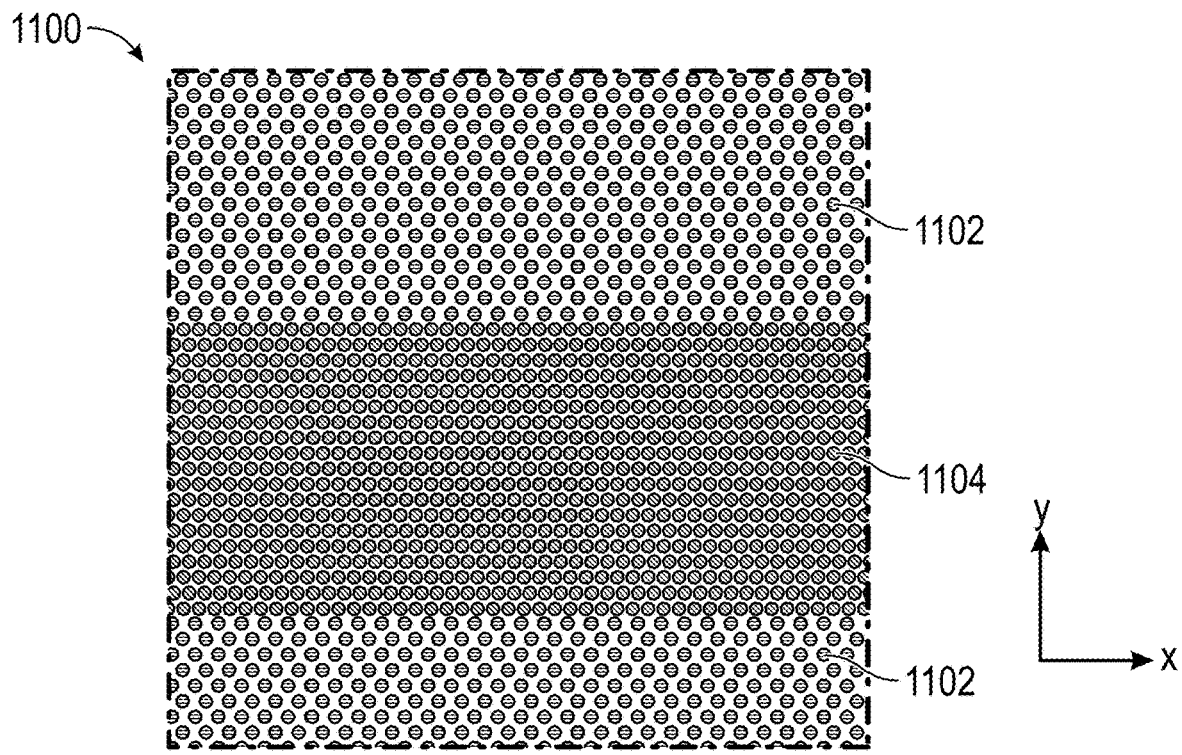
FIG. 11A shows an initial drop pattern having a first grid pattern and a second grid pattern, prior to a grid pattern being shifted, in accordance with an example embodiment.
Figure 11B:
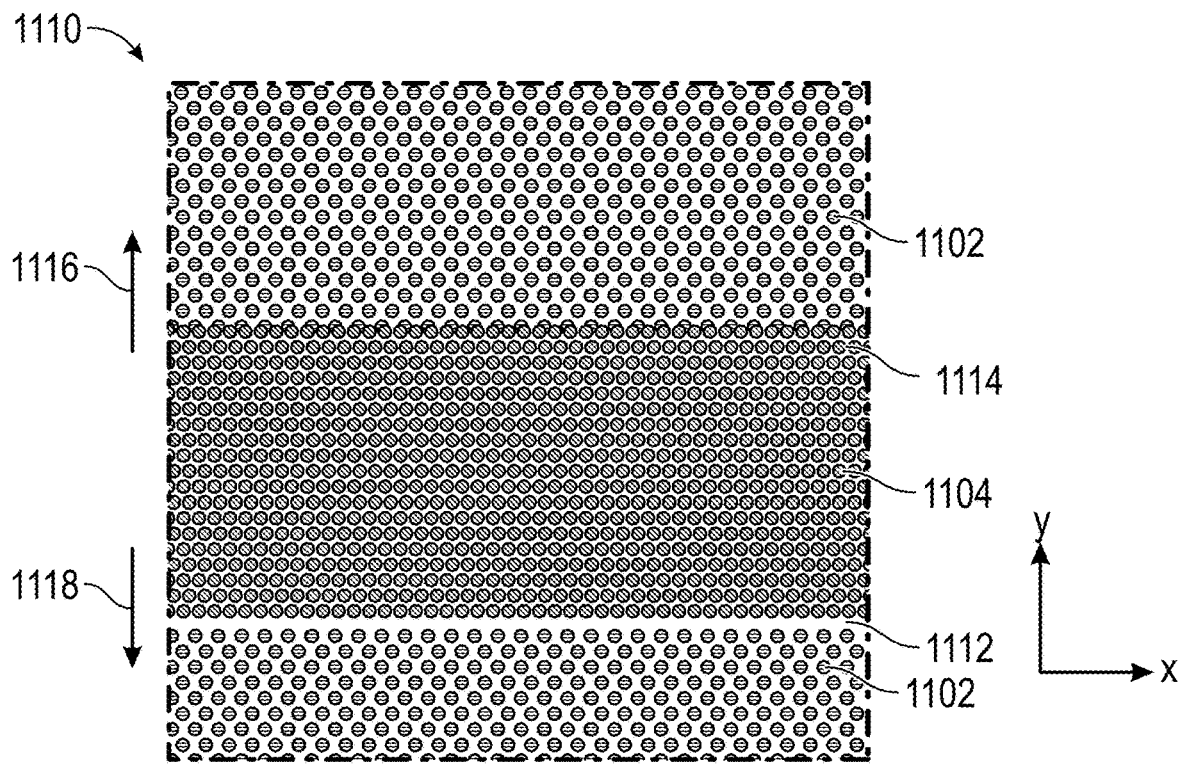
FIG. 11B shows a modified drop pattern where one of the grid patterns of FIG. 11A, has been shifted, in accordance with an example embodiment.

Turning to FIGS. 11A and 11B, these figures illustrates an example drop pattern having a combination of grid patterns, where one of the grid patterns has been shifted. FIG. 11A shows an initial drop pattern 1100 having a first grid pattern 1102 and a second grid pattern 1104, prior to a grid pattern being shifted. That is, FIG. 11A shows an initial drop pattern 1100 as in step S1002. In one example embodiment, the first grid pattern 1102 may be a "3×4" grid pattern with a single stagger (i.e., the grid pattern 600 of FIG. 6A), also referred herein as "3×4s1", and the second grid pattern 402 may be a "2×4" grid pattern with a single stagger (i.e., the grid pattern 610 of FIG. 6B), also referred herein as "2×4s1". As discussed above, in such a case, because the Y-dimension spacing in each grid pattern is "4" (i.e., a drop is dispensed at every fourth nozzle in the Y-dimension), in step S1004, both grid patterns 1102, 1104 would be designated to be dispensed from the first series of nozzles and would be dispensed on the first pass of the stage. Because the Y-dimension pitch distance 418 is one-fourth of the distance 410 between adjacent nozzles, the distance between drops in this example (where a drop is located at every fourth possible dispensing position in the Y-dimension) is also equal to the distance 410 between adjacent nozzles. FIG. 11B shows a modified drop pattern 1110 in which one of the grid patterns, specifically the second grid pattern 1104, has been shifted along the Y-dimension. As also shown in FIG. 11B, there is a blank area 1112 in which no drops are located and there is an overlap area 1114 in which drops of the second grid pattern 1104 overlap with drops of the first grid pattern 1102. In the example embodiment shown in FIG. 11B, the second grid pattern 1104 has been shifted along the Y-dimension three times the distance 418, i.e., three times the distance of one Y-dimension pitch. Because the Y-dimension pitch distance 418 is one-fourth of the distance 410 between adjacent nozzles, the shift distance in this example is also equal to three-fourths of the distance 410 between adjacent nozzles. With this amount of shifting, every drop of the second grid pattern 1104 has been shifted up by three drop dispensing positions along the set 420 of potential drop positions in the Y-dimension.

Figure 12:
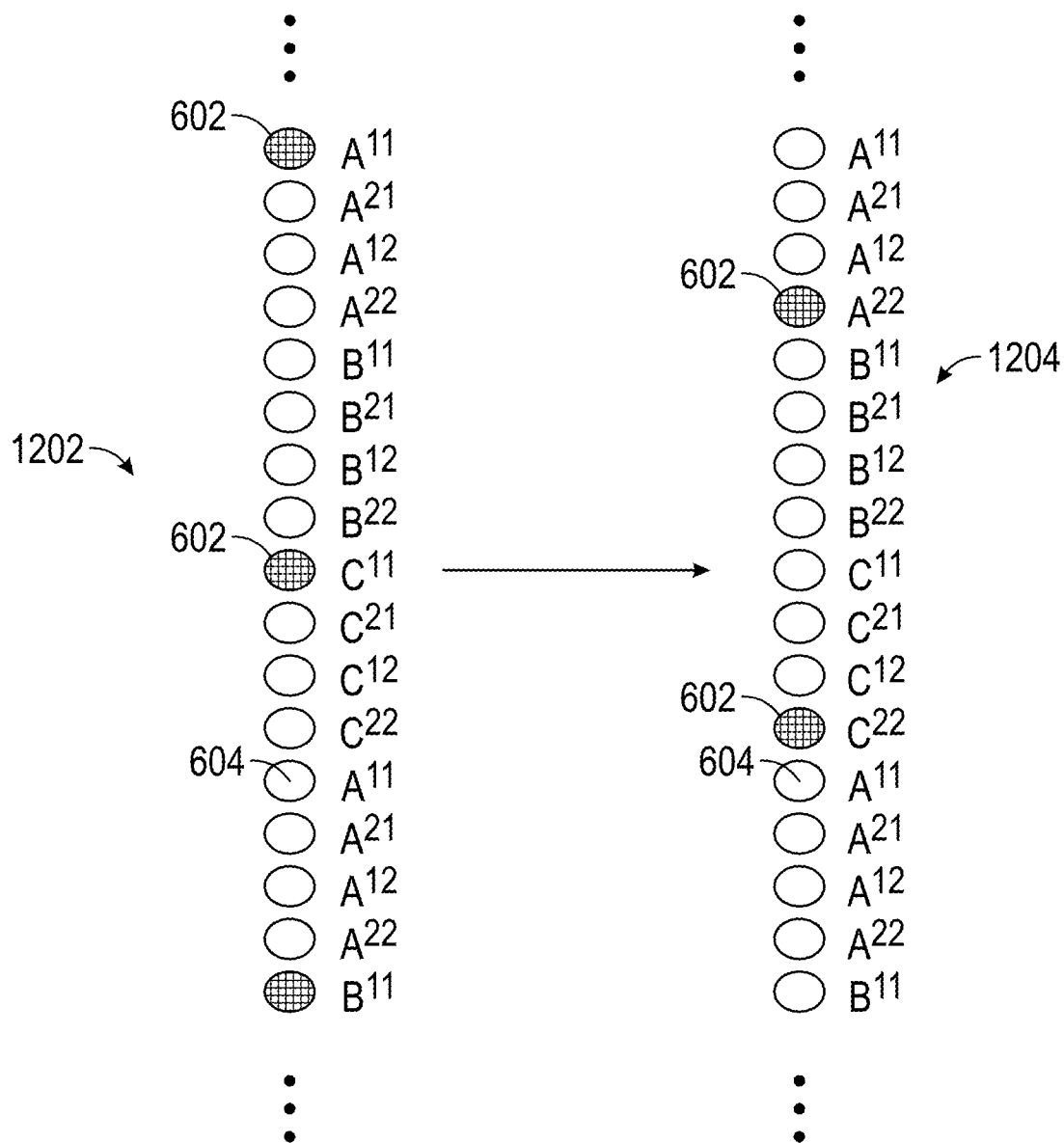
FIG. 12 shows an example embodiment where one example Y-dimension set of drops of the grid pattern of FIGS. 6A and 7A has been shifted in accordance with an example embodiment.

Because of the shift, the drops of the second grid pattern 1104 are no longer present at a dispensing position that corresponding to the first series of nozzles and the first pass. Rather, the drops of the second grid pattern 1104, while still located at every fourth dispensing position, are shifted to dispensing positions that correspond to the second series of nozzles and the second pass. FIG. 12 shows an example embodiment where one example set of Y-coordinate drop positions along a single X-coordinate of FIGS. 6A and 7A has been shifted. As seen in FIG. 12 a set of drops 1202 is shown prior to being shifted. The set of drops 1202 prior to being shifted is the same as the set shown in FIGS. 7A and 7B. That is, each of the designated nozzle positions are $A^{11}$ and $C^{11}$ such that all of the drops would be dispensed by the first series of nozzles on the first pass. FIG. 12 further shows a corresponding set of drops 1204 after the drops have been shifted by three times the Y-dimension pitch (i.e., by three drop positions) relative to the initial position. Notably, after the shifting, the drops are now positioned at dispensing positions $A^{22}$ and $C^{22}$. Accordingly, after the shifting, all of the drops will be dispensed by the second series of nozzles on the second pass. While only one set of drops is illustrated in FIG. 12 for simplicity, it should be understood that the example shifting shown in FIG. 12 would be applied to all of the sets of drops for the grid pattern being shifted.

As illustrated above, because of the shifted locations, the controller will designate the second grid pattern 1104 to be dispensed from the second series of nozzles instead of the first series of nozzles. Furthermore, as illustrated above, because of the shifted locations, in addition to the second series of nozzles dispensing the shifted grid pattern, the dispensing will occur on the second pass of the stage. However, because the first grid pattern 1102 has not been shifted, the first grid pattern 1102 would still be dispensed by the first series of nozzles during the first pass and the drops appear at the same location as in the initial drop pattern 1100. In summary, after the shifting of the second grid pattern 1104, the non-shifted grid pattern 1102 will be dispensed from the first series of nozzles during the first pass of the stage while the shifted second grid pattern 1104 will be dispensed by the second series of nozzles during the second pass (the return pass) of the stage. This step of shifting the second grid pattern 1104 to arrive at the modified drop pattern 1110 such that the second grid pattern 1104 is dispensed from the other series of nozzles (e.g., the second series of nozzles) is above-described step S1006 in FIG. 10.

After generating the modified drop pattern, the method proceeds to step S1008, where the plurality of drops according to the modified drop pattern are dispensed onto the substrate as the stage translates the substrate across the dispenser along the X-dimension. In this step, the modified drop pattern may be dispensed on a field basis as discussed above, where each drop corresponds to a particular dispensing position on the substrate. That is, as the stage travels across the dispenser during the first and second passes (forward and return passes), the series of nozzles will dispense all the sets 420 of drops of modified drop pattern 1110. As noted above, in the example embodiment where the first grid pattern 1102 is a "3×4" pattern and the second grid pattern 1104 is a "2×4" pattern, and where the second grid pattern 1104 has been shifted by three times the Y-dimension pitch distance 418, the first series of nozzles will dispense the non-shifted first pattern 1102 during the first pass of the stage and the second series of nozzles will dispense the shifted second grid pattern 1104 during the second pass of the stage. As also noted above, the dispensing system is configured such that the first series of nozzles can dispense drops at a first voltage setting and second series of nozzles can dispense drops at a second voltage system. Thus, by taking advantage of this feature of the dispensing system, by shifting the second grid pattern to the second series of nozzles, the controller can apply separate voltages to each pattern. In other words, the first grid pattern 1102 can be dispensed at a first voltage and the shifted second grid pattern 1104 can be dispensed at second voltage that is different from the first voltage. Accordingly, in a situation where all of the grid patterns would have been dispensed from the first series nozzles (or all from the second series of nozzles), it is not possible to apply different voltages when dispensing different grid pattern. However, by performing the step S1006 of generating the modified drop pattern where a grid pattern is shifted, it is possible to dispense different grid patterns at different voltages. Thus, the step S1008 of dispensing the plurality of drops according to the modified drop pattern may further include dispensing the drops from the first series of nozzles at a first voltage and dispensing the drops from the second series of nozzles at a second voltage, where the first voltage is different from the second voltage. Choosing the particular voltage for each series of nozzles is described below.

The dispensing method 1000 further includes a step S1010 of shifting a position of the stage along the Y-dimension in a second direction opposite to the first direction by an amount equal to the shift distance between the initial position and the shifted position. Step S1010 is a sub-step of the dispensing step S1008. That is, during the dispensing, and more particularly at the specific moment that the shifted grid pattern is being dispensed, the stage is shifted along the Y-dimension equal to and opposite the amount that the grid pattern was shifted. For example, in the embodiment described above, the second grid pattern 1104 was shifted by three times the Y-dimension pitch distance 418 in a first direction 1116. In this case, at the same moment that the drops of the shifted grid pattern 1104 are being dispensed, the stage is shifted by a distance equal to three times the Y-dimension pitch distance 418 in a second direction 1118 that is opposite the first direction 1116. As noted above, three times the Y-dimension pitch 418 is equal to three-fourths of the distance 410 between adjacent nozzles. By shifting the stage in the Y-dimension by an amount equal and opposite to the Y-dimension shifting of the shifted grid pattern 1004, the drops will end up at the same position as the initial drop pattern on the substrate. In other words, if not for the shifting of the position of the stage equal and opposite to the grid pattern shifting, the shifted grid pattern would be dispensed by three times the Y-dimension pitch 418 deviated from the initial drop pattern target on the substrate. Nevertheless, because the equal and opposite stage shifting has been implemented, all of the drops will end up in the originally desired location despite being shifted. That is, in the example embodiment described above, the drops of the shifted grid pattern are able to be dispensed by the second series of nozzles during the second pass of the stage, but the drops will still end up in the originally desired location. This allows for different voltages to be applied to different grid patterns while still maintaining the originally desired drop pattern. As noted above, in another example embodiment, the dispenser can move and the stage can be stationary. In this embodiment the controller may control movement of the dispenser in the same manner described above with respect to the stage.

After the dispensing step S1008, including the shifting of the stage step S1010, the method may proceed to step S1012, where the dispensed drops are contacted with a template or superstrate to form a film. That is, after dispensing the modified drop pattern, which ultimately appears on the substrate in the same pattern as the initial pattern due to the stage shifting, the method proceeds with the standard imprinting/planarization steps discussed above in FIG. 3. Thus, step S1012 is equivalent to step S304 in FIG. 3. The method may then proceed with the remaining steps discussed above with respect to FIG. 3, including spreading the formable material, curing the formable material, separating the template/superstrate from the substrate, and processing the substrate.

Returning to the voltage applied to the series of nozzles, as discussed above, each series of nozzles can dispense the drops at a different voltage, which controls the volume of the drop being dispensed. The precise voltage to be applied to each series of nozzles may be determined using an iterative process to arrive at voltages that will result in an RLT delta as close as possible to a desired RLT delta. The iterative process may include performing the above steps S1008 though S1012, including curing the dispensed curable material, where a different voltage is applied each instance that that shifted grid pattern dispensed from the second series of nozzles. The voltage may be kept constant for the non-shifted grid pattern dispensed from the first series of nozzles. The initial voltage used during the first test may be selected based on the calibration curve. The RLT delta between the two grid patterns may then be measured after curing. In the next iteration, the voltage applied to the drops of the shifted grid pattern dispensed from the second series of nozzles may be increased by an amount based on how much adjustment is needed to get closer to the target. This process may be repeated until measured RLT delta is sufficiently close to the target value for the particular fabrication. After conducting these iterations and collecting the data points, a calibration curve can be generated which indicates what voltage should be applied to each series of nozzles in order to achieve a particular RLT delta value for a particular combination of different grid patterns. Once the calibration curve has been established, the ideal voltage can be selected to achieve the RLT delta that is closest to the desired RLT delta based on the particular topography of the wafer at the section in which the drops are being dispensed. Thus, the fabrication method descried herein provides the ability to use a combination of different grid patterns and also achieve RLT delta values between different grid patterns that are closer to the desired RLT delta values than would normally be possible when the same voltage must be applied to all of the nozzles.

Using this method, the first voltage and the second voltage can be selected such that the RLT delta is less than a threshold value. That is the RLT delta achieved by the method is within a certain value from the target RLT delta. The threshold value may be 2 nm or less, more preferably 1.5 nm or less, more preferably 1.0 nm or less, more preferably 0.5 nm or less, more preferably 0.25 nm or less, and more preferably 0.1 nm or less. When the method achieves the exact desired RLT delta, the threshold is 0. The threshold value may also be 0.1 nm to 2 nm, 0.25 nm to 1.5 nm, or 0.5 nm to 1.0 nm.

Examples and Comparative Examples

The following examples were prepared according to the above-described method. Two different grid patterns were used in the examples. One of the grid patterns is the pattern shown in FIG. 6A (i.e., 2×4s1) and the other grid pattern is the pattern shown in FIG. 6B (i.e., 3×4s1). For these examples, a single substrate having uniform features was used. The template had no features. Thus, the topography was kept constant. All process parameters were kept constant during the various dispensing. As noted above, because each of the grid patterns of FIG. 6A and FIG. 6B have a drop every fourth position along the Y-dimension, in the initial drop pattern, each of the patterns would be designated to be dispensed from the first series of nozzles of the dispenser. A modified drop pattern was generated such that the grid pattern of FIG. 6A was shifted by three-fourths of a distance between adjacent nozzles in the Y-dimension (i.e., shifted by three Y-dimension pitches). Thus, for the reasons explained above, in the modified drop pattern, the grid pattern of FIG. 6A is designated to be dispensed from the second series of nozzles. The modified drop pattern was then dispensed where a first voltage was applied to the first series of nozzles and a second voltage was applied to the second series of nozzles. The particular voltages applied to the first and second series of nozzles are set forth in Table 1 below. During the dispensing of pattern of FIG. 6A using the second series of nozzles, the stage was shifted along the Y-dimension by the same amount the grid pattern was shifted (i.e., three-fourths of a distance between adjacent nozzles in the Y-dimension or three Y-dimension pitches) and in a direction opposite the shifting of the grid pattern. After dispensing the combination of grid patterns, the template was contacted with the drops, and the drops were cured. After curing, the RLT was measured for each dispensed grid pattern. The measured RLT for each dispensed pattern at a particular voltage is reported in Table 1 below. Finally, the RLT delta (i.e., the difference between the measured RLT of each pattern) is reported in Table 1.

TABLE 1

| Example | Voltage (V) Applied to First Series of Nozzles Dispensing Pattern of FIG. 6B (3×4s1) | RLT (nm) of Dispensed Pattern of FIG. 6B (3×4s1) | Voltage (V) Applied to Second Series of Nozzles Dispensing Pattern of FIG. 6A (2×4s1) | RLT (nm) of Dispensed Pattern of FIG. 6A (2×4s1) | RLT Delta (nm) |
|---|---|---|---|---|---|
| 1 | 19.6 | 34.0 | 18.8 | 44.9 | 10.9 |
| 2 | 19.6 | 34.0 | 19 | 46.2 | 12.1 |
| 3 | 19.6 | 34.0 | 19.2 | 47.4 | 13.3 |

TABLE 1-continued

| Example | Voltage (V) Applied to First Series of Nozzles Dispensing Pattern of FIG. 6B (3x4s1) | RLT (nm) of Dispensed Pattern of FIG. 6B (3x4s1) | Voltage (V) Applied to Second Series of Nozzles Dispensing Pattern of FIG. 6A (2x4s1) | RLT (nm) of Dispensed Pattern of FIG. 6A (2x4s1) | RLT Delta (nm) |
|---|---|---|---|---|---|
| 4 | 19.6 | 34.0 | 19.3 | 48.0 | 13.9 |
| 5 | 19.6 | 34.0 | 19.5 | 49.2 | 15.2 |
| 6 | 19.6 | 34.0 | 19.6 | 49.8 | 15.8 |
| 7 | 19.6 | 34.0 | 19.8 | 51.0 | 17.0 |
| 8 | 19.6 | 34.0 | 19.9 | 51.6 | 17.6 |
| 9 | 19.6 | 34.0 | 20.1 | 52.8 | 18.8 |
| 10 | 19.6 | 34.0 | 20.3 | 54.0 | 20.0 |

As seen in Table 1, the voltage applied to the first series of nozzles (i.e., the grid pattern of FIG. 6B) was kept constant for all of the examples. However, because the grid pattern of FIG. 6A was dispensed by the second series of nozzles, different voltages were used for different examples. While the same voltage was used for the first series of nozzles, it should be understood that in other examples the voltage applied to the first series of nozzles could also be varied. Table 1 demonstrates that by having the ability to use a different voltage for different series of nozzles, the RLT delta can be finely adjusted to the needs of a particular fabrication. That is, even when the voltage of the first series of nozzles is kept the same, by varying the voltage of the second series of nozzles, a wide variety of RLT delta values can be achieved, ranging from 10.9 to 20.0. Furthermore, as shown in Table 1, by using different voltages for the second series of nozzles, the precise RLT delta can be finely tuned. That is, by changing the voltage on the second series of nozzles by an increment of 0.1, the RLT delta is changed by as little as 0.6 nm. In other words, by using the method described herein, the RLT delta can be finally tuned to be very close to the desired RLT delta. This fine tuning cannot be achieved when all of the drops are dispensed from one series of nozzles because the same voltage is applied to all of the drops.

The following comparative examples were prepared using the above-described calibration curves shown in FIG. 9 as predictors for the RLT delta between two different grid patterns in which the all of the drops are dispensed from one series of nozzles, thereby all being dispensed at a constant voltage. The comparative examples represent a situation in which the initial drop pattern is instead used without any modifications and without any shifting of the stage. Because the comparative examples are based on the calibration curves, the data represents a situation in which a featureless template and featureless substrate are used. Table 2 below shows the results of the predictive RLT delta between different grid patterns based the calibration curves.

TABLE 2

| Comparative Example | voltage (V) | Pattern 1 | Pattern 2 | RLT Pattern 1 (nm) | RLT Pattern 2 (nm) | RLT Delta (nm) |
|---|---|---|---|---|---|---|
| 1 | 19.6 | 2x4s1 | 3x4s1 | 49.7 | 34.1 | 15.6 |
| 2 | 19.6 | 2x4s1 | 4x4s1 | 49.7 | 26.2 | 23.5 |
| 3 | 19.6 | 2x4s1 | 5x4s1 | 49.7 | 20.8 | 28.9 |
| 4 | 19.6 | 2x4s1 | 6x4s1 | 49.7 | 17.2 | 32.5 |
| 5 | 19.3 | 2x4s1 | 3x4s1 | 47.9 | 32.9 | 15 |
| 6 | 19.3 | 2x4s1 | 4x4s1 | 47.9 | 25.3 | 22.6 |
| 7 | 19.3 | 2x4s1 | 5x4s1 | 47.9 | 20.1 | 27.8 |
| 8 | 19.3 | 2x4s1 | 6x4s1 | 47.9 | 16.6 | 31.3 |
| 9 | 19.9 | 2x4s1 | 3x4s1 | 51.5 | 35.3 | 16.2 |
| 10 | 19.9 | 2x4s1 | 4x4s1 | 51.5 | 27.1 | 24.4 |
| 11 | 19.9 | 2x4s1 | 5x4s1 | 51.5 | 21.5 | 30 |
| 12 | 19.9 | 2x4s1 | 6x4s1 | 51.5 | 17.7 | 33.8 |
| 13 | 19.6 | 3x4s1 | 2x4s1 | 34.1 | 49.7 | 15.6 |
| 14 | 19.6 | 3x4s1 | 4x4s1 | 34.1 | 26.2 | 7.9 |
| 15 | 19.6 | 3x4s1 | 5x4s1 | 34.1 | 20.8 | 13.3 |
| 16 | 19.6 | 3x4s1 | 6x4s1 | 34.1 | 17.2 | 16.9 |
| 17 | 19.3 | 3x4s1 | 2x4s1 | 32.9 | 47.9 | 15 |
| 18 | 19.3 | 3x4s1 | 4x4s1 | 32.9 | 25.3 | 7.6 |
| 19 | 19.3 | 3x4s1 | 5x4s1 | 32.9 | 20.1 | 12.8 |
| 20 | 19.3 | 3x4s1 | 6x4s1 | 32.9 | 16.6 | 16.3 |
| 21 | 19.9 | 3x4s1 | 2x4s1 | 35.3 | 51.5 | 16.2 |
| 22 | 19.9 | 3x4s1 | 4x4s1 | 35.3 | 27.1 | 8.2 |
| 23 | 19.9 | 3x4s1 | 5x4s1 | 35.3 | 21.5 | 13.8 |
| 24 | 19.9 | 3x4s1 | 6x4s1 | 35.3 | 17.7 | 17.6 |

As shown in Table 2, because all of the grid patterns would be dispensed from the same series of nozzle, whatever voltage is applied in a particular comparative example is applied to both grid patterns in the combination. That is, in the voltage column, the reported voltage is applied to for both grid patterns shown in the grid pattern columns. The grid pattern designation in Table 2 follows the same identification system discussed above, where the first number represents how often there is a drop in the X-dimension and the second number represents how often there is a drop in Y-dimension, with the s1 representing a single stagger pattern. As shown in Table 2, by using different combinations of grid patterns (i.e., patterns with different densities), there is some control over the RLT delta. However, as also shown in Table 2, when varying the voltage, because the changed voltage must be applied to both grid patterns, only discrete RLT deltas can be achieved using this method. In other words, even when selecting the best combination of grid patterns for a particular fabrication, when both patterns are dispensed at the same voltage, the achievable RLT deltas are greatly limited. However, by using the inventive method described herein, where one voltage can be applied to one grid pattern and a different voltage can be applied to a different grid pattern, as shown in the examples, there is much more precise control over the RLT delta.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A fabrication method comprising:
   selecting an initial drop pattern defining a position of drops of a formable material in a two-dimensional plane having an X-dimension and a Y-dimension, the initial drop pattern comprising a grid pattern of drops, the grid pattern defining a spacing between the drops in the Y-dimension and the grid pattern having an initial position within the plane,
   designating the drops of the grid pattern to be dispensed by a first series of nozzles of a dispenser based on the spacing between drops in the Y-dimension and based on the initial position;
   generating a modified drop pattern by shifting the grid pattern in a first direction along the Y-dimension from the initial position to a shifted position, wherein a shift distance between the initial position and the shifted position is selected such that the drops of the shifted grid pattern are designated to be dispensed from a second series of nozzles of the dispenser;
   dispensing the plurality of drops according to the modified drop pattern onto a substrate as a stage supporting the substrate translates the substrate across the dispenser along the X-dimension or as the dispenser translates across the substrate along the X-dimension;
   during the dispensing of the drops of the shifted grid pattern, shifting a position of the stage or the dispenser along the Y-dimension in a second direction opposite to the first direction by an amount equal to the shift distance between the initial position and the shifted position; and
   contacting the dispensed drops with a template or superstrate to form a film.

2. The method of claim 1,
   wherein the translation of the substrate across the dispenser comprises a first pass of the substrate across the dispenser along the X-dimension in a first direction and a second pass of the substrate across the dispenser along the X-dimension in a second direction opposite to the first direction, and
   wherein the shift distance between the initial position and the shifted position is further selected such that the drops of the shifted grid pattern are designated to be dispensed during the second pass of the substrate across the dispenser.

3. The method of claim 1, wherein the first series of nozzles and the second series of nozzles are aligned with the Y-dimension.

4. The method of claim 1, wherein the initial position is based on a position of a drop to be dispensed first during the dispensing.

5. The method of claim 1,
   wherein the dispensing further comprises actuating the first series of nozzles at a first voltage and actuating the second series of nozzles at a second voltage, and
   wherein the first voltage is different from the second voltage.

6. The method of claim 5, wherein the first voltage the second voltage are predetermined values.

7. The method of claim 5, wherein the second voltage is selected from a chart correlating voltage with residual layer thickness for the grid pattern.

8. The method of claim 7,
   wherein the initial drop pattern comprises a plurality of grid patterns, the plurality of grid patterns including the grid pattern and a different grid pattern, the different grid pattern defining a spacing between the drops in the Y-dimension, and
   wherein the first voltage is selected from a chart correlating voltage with residual layer thickness for the different grid pattern.

9. The method of claim 7,
   wherein the initial drop pattern comprises a plurality of grid patterns, the plurality of grid patterns including the grid pattern and a different grid pattern, the different grid pattern defining a spacing between drops in the Y-dimension, and
   wherein the first voltage and the second voltage are selected such that a difference between a residual layer thickness of a first layer portion formed from dispensing the drops of the grid pattern and a residual layer thickness of a second layer portion formed from dispensing the drops of the different grid pattern is less than a threshold value.

10. The method of claim 9, wherein the threshold value is 2 nm or less.

11. The method of claim 1, wherein the spacing between the drops in the Y-dimension is a multiple of one-quarter of a distance between two adjacent nozzles of the first or second series of nozzles in the Y-dimension.

12. The method of claim 1, wherein the spacing between the drops in the Y-dimension of the grid pattern is equal to a distance between adjacent nozzles of the first or second series of nozzles in the Y-dimension.

13. The method of claim 12, wherein the spacing between the drops in the Y-dimension of the different grid pattern is equal to a distance between adjacent nozzles of the first or second series of nozzles in the Y-dimension.

14. The method of claim 12, wherein the spacing between drops in the X-dimension of the grid pattern is different from the spacing between the drops in the X-dimension of the different grid pattern.

15. The method of claim 1,
   wherein the initial drop pattern comprises a plurality of grid patterns, the plurality of grid patterns including the grid pattern and a different grid pattern, the different grid pattern defining a spacing between drops in the Y-dimension, and
   wherein generating the modified grid pattern comprises not shifting the different grid pattern.

16. The method of claim 1, wherein the shift distance between the initial position and the shifted position is equal to three-fourths of a distance between adjacent nozzles of the first or second series of nozzles in the Y-dimension.

17. The method of claim 1, wherein the grid pattern is a staggered pattern or a boxed pattern.

18. The method of claim 1, wherein the second series of nozzles is offset along the Y-dimension by a distance equal to one-half a distance between adjacent nozzles of the first series of nozzles.

19. A dispensing system, comprising:
   a chuck configured to hold a template or superstrate;
   a stage configured to position a substrate;
   one or more processors configured to:
      select an initial drop pattern defining a position of drops of a formable material in a two-dimensional plane having an X-dimension and a Y-dimension, the initial drop pattern comprising a grid pattern of drops, the grid pattern defining a spacing between the drops in the Y-dimension and the grid pattern having an initial position within the plane;

designate the drops of the grid pattern to be dispensed by a first series of nozzles of a dispenser based on the spacing between drops in the Y-dimension and based on the initial position; and generate a modified drop pattern by shifting the grid pattern in a first direction along the Y-dimension from the initial position to a shifted position, wherein a shift distance between the initial position and the shifted position is selected such that the drops of the shifted grid pattern are designated to be dispensed from a second series of nozzles of the dispenser;

a fluid dispenser configured to dispense the plurality of drops according to the modified drop pattern onto a substrate as the stage translates the substrate across the dispenser along the X-dimension or as the dispenser translates across the substrate along the X-dimension, wherein during the dispensing of the drops of the shifted grid pattern, a position of the stage or the dispenser is shifted along the Y-dimension in a second direction opposite to the first direction by an amount equal to the shift distance between the initial position and the shifted position;

a positioning system configured to contact the dispensed drops with the template or superstrate to form a film; and a curing system configured to cure the dispensed drops under the template or superstrate so as to form a cured material on the substrate.

20. A method of making an article, comprising:

selecting an initial drop pattern defining a position of drops of a formable material in a two-dimensional plane having an X-dimension and a Y-dimension, the initial drop pattern comprising a grid pattern of drops, the grid pattern defining a spacing between the drops in the Y-dimension and the grid pattern having an initial position within the plane;

designating the drops of the grid pattern to be dispensed by a first series of nozzles of a dispenser based on the spacing between drops in the Y-dimension and based on the initial position;

generating a modified drop pattern by shifting the grid pattern in a first direction along the Y-dimension from the initial position to a shifted position, wherein a shift distance between the initial position and the shifted position is selected such that the drops of the shifted grid pattern are designated to be dispensed from a second series of nozzles of the dispenser;

dispensing the plurality of drops according to the modified drop pattern onto a substrate as a stage supporting the substrate translates the substrate across the dispenser along the X-dimension or as the dispenser translates across the substrate along the X-dimension;

during the dispensing of the drops of the shifted grid pattern, shifting a position of the stage or dispenser along the Y-dimension in a second direction opposite to the first direction by an amount equal to the shift distance between the initial position and the shifted position;

contacting the dispensed drops with a template or superstrate to form a film;

forming the film of the dispensed drops on the substrate as a result of completing the contacting of the template or superstrate with the dispensed drops; and processing the formed pattern or layer to make the article.

* * * * *